(12) United States Patent
Kang et al.

(10) Patent No.: US 8,183,567 B2
(45) Date of Patent: *May 22, 2012

(54) ARRAY SUBSTRATE FOR LIQUID CRYSTAL DISPLAY DEVICE AND METHOD OF FABRICATING THE SAME

(75) Inventors: Su Hyuk Kang, Seoul (KR); Dai Yun Lee, Uiwang-si (KR); Yong In Park, Annyang-si (KR); Young Joo Kim, Annyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/985,144

(22) Filed: Jan. 5, 2011

(65) Prior Publication Data

US 2011/0133199 A1    Jun. 9, 2011

Related U.S. Application Data

(62) Division of application No. 12/318,284, filed on Dec. 23, 2008, now Pat. No. 7,888,151, which is a division of application No. 11/449,620, filed on Jun. 9, 2006, now Pat. No. 7,482,628.

(30) Foreign Application Priority Data

Sep. 30, 2005 (KR) .......................... 10-2005-0092286

(51) Int. Cl.
*H01L 31/00* (2006.01)
*H01L 29/10* (2006.01)
*H01L 20/04* (2006.01)
(52) U.S. Cl. ................. 257/57; 257/59; 257/72; 257/83; 438/40

(58) Field of Classification Search .................... 257/57, 257/59
See application file for complete search history.

(56) References Cited

U.S. PATENT DOCUMENTS 5,696,568 A   12/1997   Yamamoto et al.
(Continued)

FOREIGN PATENT DOCUMENTS

CN           1381898 A      11/2002
(Continued)

OTHER PUBLICATIONS

JP 08-116063 [machine's translation].*

*Primary Examiner* — Tony Tran
(74) *Attorney, Agent, or Firm* — McKenna Long & Aldridge, LLP

(57) ABSTRACT

An array substrate for an LCD device includes a first TFT including a first semiconductor layer, a first gate electrode, wherein the first gate electrode is directly over the first semiconductor layer; a first protrusion extending from the first gate electrode along an edge of the first semiconductor layer; a second TFT including a second semiconductor layer, a second gate electrode, wherein the second gate electrode is directly over the second semiconductor layer; a second protrusion extending from the second gate electrode along an edge of the second semiconductor layer; a third TFT connected to crossed data and gate lines including a third semiconductor layer, a third gate electrode, wherein the third gate electrode is directly over the third semiconductor layer; a third protrusion extending from the third gate electrode along an edge of the third semiconductor layer; and a pixel electrode.

6 Claims, 28 Drawing Sheets

U.S. PATENT DOCUMENTS

| | | |
|---|---|---|
| 6,479,838 B2 | 11/2002 | Morosawa |
| 2003/0194839 A1 | 10/2003 | Chung |
| 2005/0099551 A1 | 5/2005 | Yang et al. |
| 2005/0133791 A1 | 6/2005 | Yang |
| 2008/0048264 A1 | 2/2008 | Seko et al. |

FOREIGN PATENT DOCUMENTS

| | | |
|---|---|---|
| JP | 05-235360 | 9/1993 |
| JP | 07-128685 | 5/1995 |
| JP | 8-116063 | 5/1996 |
| JP | 09-105953 | 4/1997 |
| JP | 09-172183 | 6/1997 |
| JP | 2002-311453 | 10/2002 |
| JP | 2002-353135 | 12/2002 |
| JP | 2004-303791 | 10/2004 |

* cited by examiner doping with n+ type impurities doping with p+ type impurities doping with n+ type impurities doping with p+ type impurities

1

ARRAY SUBSTRATE FOR LIQUID CRYSTAL DISPLAY DEVICE AND METHOD OF FABRICATING THE SAME

CROSS-REFERENCE TO RELATED APPLICATIONS

This application is a Divisional of application Ser. No. 12/318,284 filed Dec. 23, 2008, now U.S. Pat. No. 7,888,151 now allowed, which is a Divisional Application of application Ser. No. 11/449,620 filed Jun. 9, 2006, now U.S. Pat. No. 7,482,628; which claims priority to Korean Patent Application No. 10-2005-0092286, filed Sep. 30, 2005, all of which are hereby incorporated by reference as if fully set forth herein.

BACKGROUND OF THE INVENTION

1. Field of the Invention

The present invention relates to a liquid crystal display device. More particularly, the present invention relates to an array substrate for the liquid crystal display device having an integrated driving circuit and a method of fabricating the same.

2. Discussion of the Related Art

In general, a liquid crystal display (LCD) device uses the optical anisotropy and the polarization properties of liquid crystal molecules to display images. The LCD device includes first and second substrate facing each other and a liquid crystal layer interposed therebetween. The first substrate, referred to as an array substrate, includes a thin film transistor (TFT) that is used as a switching element. The second substrate, referred to as a color filter substrate, includes a color filter. The TFT includes a semiconductor layer made of amorphous silicon or polycrystalline silicon. Because a process using amorphous silicon is performed at a relatively low temperature and requires a relatively cheap insulating substrate, amorphous silicon has been widely used in TFTs. However, because the amorphous silicon has randomly arranged silicon atoms, a weak bonding strength between silicon atoms, dangling bonds and low field effect mobility occur in amorphous silicon. Accordingly, the TFT of the amorphous silicon is not adequate for a driving circuit (DC).

In contrast, because the polycrystalline silicon has an excellent field effect mobility, polycrystalline silicon is used for the TFT of the driving integrated circuit. Also, when the DC is formed on a substrate using polycrystalline silicon without using a tape automated bonding (TAB), an LCD device may become compact and the production cost of the LCD device may decrease.

FIG. 1 is a schematic plan view showing an array substrate for an LCD device according to the related art. As shown in FIG. 1, the first substrate 30 includes a display region D1 and a non-display region D2. A pixel region P, a TFT T on the pixel region P and a pixel electrode 17 connected to the TFT are formed in the display region D1. In addition, a gate line 12 along a first direction of the pixel region P and a data line 14 are formed to define the pixel region P. A gate DC 16 and a data DC 18 are formed on the non-display region D2 of the first substrate 30. The gate DC 16 and the data DC 18 supply a control signal and a data signal to the pixel region P through the gate line 12 and the data line 14, respectively. The gate DC 16 and the data DC 18 each has a TFT with a complementary metal-oxide semiconductor (CMOS) structure to output a suitable signal applied to the pixel region P. The TFT with the CMOS structure is used for rapidly treating signals in the driving integrated circuit. The CMOS structure includes n-type and p-type semiconductors.

FIG. 2 is a schematic plan view showing a display region of an LCD device having an integrated driving circuit on a first substrate according to the related art. As shown in FIG. 2, the display region of the first substrate 30 includes the gate line GL, the data line DL, the TFT T, the pixel electrode 70 and a storage capacitor Cst. The gate line GL and the data line DL cross each other to define the pixel region P, and the TFT T is formed at a crossing portion of the gate and data lines GL and DL. The pixel electrode 70 and the storage capacitor Cst are formed in the pixel region P. Because cross-talk is generated between the pixel electrode 70 and the gate line GL or the data line DL when the pixel electrode 70 overlaps the gate and data lines GL and DL, the quality of displayed images deteriorates. Thus, the pixel electrode 70 is spaced apart from the gate and data lines GL and DL. A black matrix 82 covers regions between the pixel electrode 70 and the gate and data lines GL and DL. The black matrix 82 also covers regions corresponding to the TFT T and the storage capacitor Cst.

FIG. 3A is a cross-sectional view showing a display region taken along the line III-III of FIG. 2 and FIG. 3B is a cross-sectional view showing a non-display region. A liquid crystal panel LP is shown. The first substrate 30 includes the TFT T, gate line GL, data line DL, and the pixel electrode 70. The TFT T may include a semiconductor layer 38, a gate electrode 52, a source electrode 72a and a drain electrode 72b. The TFT T may be formed by a process. First, a buffer layer 32 is formed on the first substrate 30. Then, the semiconductor layer 38 is formed on the buffer layer 32 by depositing, patterning and crystallizing amorphous silicon. A gate insulating layer 46 is deposited on the semiconductor layer 38. The gate electrode 52 and 54 are formed by depositing and patterning a conductive metal. Then, an interlayer insulating layer 60, the source and drain electrode 72a and 72b and a passivation layer 76 are sequentially formed. The pixel electrode 70 is formed on the passivation layer 76 to be connected to the drain electrode 72b through a drain contact hole of the passivation layer 76.

The second substrate 80 includes the black matrix 82, a color filter layer 84 and a common electrode 86. A liquid crystal layer LC is interposed between the first substrate 30 and the second substrate 80. The color filter layer 84 includes red, green and blue sub-color filters corresponding to the pixel region P. The common electrode 86 is formed on the color filter 84. The black matrix 82 is formed corresponding to the non-display region D2, the TFT T and the storage capacitor Cst. Also, the black matrix 82 covers the regions between the pixel electrode 70 and the gate line GL and the data line DL to block light passing through the regions. When the black matrix 82 is formed, a margin α that compensates for misalignment of the first substrate 30 and the second substrate 80 should be considered. Without the margin α, or a margin α and L, the quality of displayed images is deteriorated due to light leakage resulting from the misalignment of the first substrate 30 and the second substrate 80. Unfortunately, the margin causes the aperture ratio of the LCD device to decrease.

As shown in FIG. 3A, the DC is formed on the non-display region D2. The DC may include a CMOS structure including the n-type TFT T(n) of polycrystalline silicon and the p-type TFT T(p) of polycrystalline silicon. The TFT may be an n-type or a p-type TFT. The DC includes the TFTs T(n) and T(p) made of polycrystalline silicon having a CMOS structure. The TFTs T(n) and T(p) include the gate electrodes 48 and 50, the source electrodes 68a and 70a and the drain electrodes 68b and 70b. Because the gate insulating layer is formed as a thin layer on the semiconductor layer, the gate insulating layer has a step difference. Due to the step difference, the gate electrode can be disconnected in a crossing portion of the gate electrode and the semiconductor layer.

FIGS. 4A and 4B are enlarged perspective views showing the portion "F" of FIG. 2. As shown in FIGS. 4A and 4B, in the TFT T, the semiconductor layer 38 is formed on the first substrate 30 by depositing, patterning and crystallizing amorphous silicon. The semiconductor layer 38 is connected to the source and drain electrode 68a and 68b through first and second contact holes 66a and 66b. The gate insulating layer 46 is formed on the semiconductor layer 38, and then the gate electrode is formed on the gate insulating layer 46 by depositing and patterning conductive metal. The step difference of the gate insulating layer 38 affects the gate electrode 52. When the gate electrode 52 is formed using an etchant, the etchant pools into a crossing region G of the gate electrode 52 and the semiconductor layer 38 having the step difference. Accordingly, the gate electrode 52 is over etched to an extent that the gate electrode 52 becomes disconnected. Also, the process of fabricating the array substrate has many process steps. Thus, the process is disadvantageous.

FIGS. 5A to 5I and FIGS. 6A to 6I are cross-sectional views showing a process of fabricating a driving circuit and a pixel region in a display region according to the related art, respectively.

FIGS. 5A and 6A show a first mask process. As shown in FIGS. 5A and 6A, the display region D1 and the non-display region D2 are defined on the first substrate and the pixel region P is defined on the display region D1. In addition, first and second regions A1 and A2 are defined on the non-display region D2 and a switching region A3 and a storage region A4 are defined on the pixel region P.

First, the buffer layer 32 is formed on the first substrate 30 by depositing an insulating material. Then, first, second, third and fourth semiconductor layers 34, 36, 38 and 40 made of polycrystalline silicon may be formed on the buffer layer 32 in the first and second regions A1 and A2, the switching region A3 and the storage region A4 by depositing, patterning and crystallizing amorphous silicon. The first, second, third and fourth semiconductor layers 34, 36, 38 and 40 are patterned using a first patterning mask. The amorphous silicon may be crystallized using a laser. The first, second and third semiconductor layers 34, 36 and 38 function as an active layer. The fourth semiconductor layer 40 is a capacitor electrode, so the fourth semiconductor layer 40 is defined as a first storage electrode.

FIGS. 5B and 6B show a second mask process. As shown in FIGS. 5B and 6B, a photoresist is coated on entire surface of the first substrate 30 including the semiconductor layers 34, 36, 38 and 40. Then, a photoresist pattern 42 is formed to cover the first and second regions A1 and A2 and the switching region using a second patterning mask. The photoresist pattern 42 exposes the fourth semiconductor layer 40 in the storage region A4. Next, n-type or p-type ions are doped into the fourth semiconductor layer 40 using the photoresist pattern 42 as a doping mask. Because the fourth semiconductor layer 40 functions as a capacitor electrode 40, the n+ type impurities or p-type impurities are doped into the fourth semiconductor layer 40. The photoresist pattern 42 is removed from the first substrate 30.

FIGS. 5C and 6C show a third mask process. As shown in FIGS. 5C and 6C, a gate insulating layer 46 is formed on the entire surface of the first substrate 30 including the semiconductor layers 34, 36, 38 and 40 by depositing an inorganic insulating material. The inorganic insulating material may include silicon nitride and/or silicon oxide. Because the gate insulating layer 46 is formed on the semiconductor layers 34, 36, 38 and 40, the gate insulating layer 46 has a step difference. Next, first, second and third gate electrodes 48, 50 and 52 and a second storage electrode 54 are formed corresponding to the first, second, third and fourth gate electrodes 34, 36, 38 and 40, respectively, on the gate insulating layer 46 by depositing a conductive metal layer and patterning the conductive metal using a third patterning mask. The first, second and third gate electrodes 48, 50 and 52 have smaller sizes than the first, second and third semiconductor layers 34, 36 and 38, and the fourth gate electrode 54 has substantially the same size as the fourth semiconductor layer 40. Simultaneously, the gate line GL is formed in the switching region A3. The gate electrodes 48, 50 and 52 and the second storage electrode 54 are formed by wet etching the conductive metal layer using an etchant. Because the gate insulating layer 46 having the step difference affects the gate electrodes 48, 50 and 52 and the second storage electrode 54, the etchant pools into the crossing portion of the gate electrodes 48, 50 and 52 and the second storage electrode 54 and the semiconductor layers 34, 36, 38 and 40. Accordingly, the gate electrodes 48, 50 and 52 and the second storage electrode 54 are over etched to the extent that the gate electrodes 48, 50 and 52 and the second storage electrode 54 become disconnected.

FIGS. 5D and 6D show a process doping n+ type impurities into the semiconductor layer in the second region A2 and the switching region A3 using a fourth mask. As shown in FIGS. 5D and 6D, the photoresist is coated on the entire surface of the first substrate 30 and patterned using a fourth patterning mask to form the photoresist pattern 56 over the first region A1. The photoresist pattern 56 exposes the second, switching and storage regions A2, A3 and A4. Next, the n+ type impurities are doped into the second, switching and storage regions A2, A3 and A4. Consequently, the n+ type impurities are doped into both ends of the second and third semiconductor layers 36 and 38 using the second gate electrode 50 and the third gate electrode 52 as doping masks. Thus, both ends of the second and the third semiconductor layers 36 and 38 have ohmic contact characteristics. Both ends of the second and the third semiconductor layers 36 and 38 are thus defined as ohmic contact regions. The photoresist pattern 56 is then removed from the first substrate 30.

FIGS. 5E and 6E show a process doping p+ type impurities into the first region using a fifth mask. As shown in FIGS. 5E and 6E, a photoresist pattern 58 is formed on the first substrate 30 including the first, second and third gate electrode 48, 50 and 52 and the second storage electrode 54 by coating the photoresist layer and patterning the photoresist layer using the fifth patterning mask. The photoresist pattern 58 exposes the first region A1. Next, the p+ type impurities are doped into the first region A1 using the first gate electrode 78 as a doping mask. Consequently, the p+ type impurities are doped into both ends of the first semiconductor layer 34. Thus, both ends of the first semiconductor layer 34 have ohmic contact characteristics, as mentioned above. Both ends of the first semiconductor layer 34 are thus defined as ohmic contact regions.

FIGS. 5F and 6F show a sixth mask process. As shown in FIGS. 5F and 6F, an interlayer insulating layer 60 is formed on the entire surface of the first substrate 30 by depositing an inorganic insulating material such as silicon nitride and silicon oxide. Then, first contact holes 62a, 64a and 66a and second contact holes 62b, 64b and 66b are formed through the interlayer insulating layer 60 and the gate insulating layer 46 using a sixth patterning mask. The first contact holes 62a, 64a and 66a and second contact holes 62b, 64b and 66b expose the ohmic contact regions of the first, second and third semiconductor layer 34, 36 and 38.

FIGS. 5G and 6G show a seventh mask process. As shown in FIGS. 5G and 6G, source electrodes 68a, 70a and 72a and drain electrodes 68b, 70b and 72b are formed on the first substrate 30 by depositing a conductive metal layer and patterning the conductive metal layer using a seventh patterning mask. The source electrodes 68a, 70a and 72a are formed corresponding to the first, second and third semiconductor layers 34, 36 and 38, respectively, and contact respective ohmic contact regions of the first, second and third semiconductor layers 34, 36 and 38. Also, the drain electrodes 68b, 70b, 72b are formed corresponding to the first, second and third semiconductor layers 34, 36 and 38, respectively, and contact other ohmic contact regions of the first, second and third semiconductor layers 34, 36 and 38. The conductive metal may include chrome, molybdenum, tungsten, copper, aluminum alloy, etc. Simultaneously, a data line DL is formed on the display region D1. The data line DL is connected to the source electrodes 68a, 70a and 72a and crosses the gate line GL to define the pixel region P.

In the first through seventh mask processes, the CMOS structure including the n-type and p-type TFTs is formed in the non-display region D2. The n-type TFT is formed on the switching region A3 in the display region D1, and the storage capacitor Cst including the first and second storage electrode 40 and 54 is formed on the storage region A4 (Cst) in the display region D1.

FIGS. 5H and 6H show an eighth mask process. As shown in FIGS. 5H and 6H, a passivation layer 76 is formed on the entire surface of the first substrate 30 by depositing an insulating material such as silicon nitride and silicon oxide. Then, a drain contact hole 78 is formed through the passivation layer 76 to expose the drain electrode 72b in the switching region A3 by patterning the passivation layer 76 using an eighth patterning mask.

FIGS. 5I and 6I show a ninth mask process. A pixel electrode 70 is formed on the passivation layer 76 by depositing and patterning a transparent conductive metal using a ninth patterning mask. The pixel electrode 76 is formed on the pixel region P and contacts the drain electrode 72b through the drain contact hole 78. The transparent conductive metal may include indium-tin-oxide (ITO) or indium-zinc-oxide (IZO).

Through the above-mentioned processes, the array substrate according to the related art is formed.

Also, a color filter substrate may be formed through first to fourth mask processes. In the first mask process, the black matrix is formed on the second substrate. In the second, third and fourth mask process, the sub-color filters having red, green and blue colors, respectively, are formed corresponding to each pixel region. Then, the array substrate and the color filter substrate are attached to manufacture the LCD device.

As mentioned above, the LCD device according to the related art has several problems. For example, the gate electrode is disconnected at the crossing portion of the semiconductor layer and the gate electrode. Also, because the black matrix is lacking an appropriate margin, the LCD device has a low aperture ratio.

SUMMARY OF THE INVENTION

Accordingly, the present invention is directed to an array substrate for a liquid crystal display (LCD) device and a method of fabricating the same that substantially obviate one or more of the problems due to limitations and disadvantages of the related art.

An advantage of the present invention is to provide an array substrate for an LCD device that prevents a gate electrode from being disconnected by forming protrusion at a crossing portion of the gate electrode and a semiconductor layer.

Another advantage of the present invention is to provide an array substrate for an LCD device that has an improved aperture ratio by forming a black matrix on an array substrate.

Additional features and advantages of the invention will be set forth in the description which follows, and in part will be apparent from the description, or may be learned by practice of the invention. These and other advantages of the invention will be realized and attained by the structure and method particularly pointed out in the written description and claims hereof as well as the appended drawings.

To achieve these and other advantages and in accordance with the purpose of the present invention, as embodied and broadly described, an array substrate for an LCD device includes a substrate including a display region and a non-display region at a periphery of the display region; a first TFT in the non-display region, the first TFT including a first semiconductor layer, a first gate electrode over the first semiconductor layer, a first source electrode and a first drain electrode, wherein the first gate electrode is directly over the first semiconductor layer; a first protrusion extending from the first gate electrode along an edge of the first semiconductor layer; a second TFT in the non-display region, the second TFT including a second semiconductor layer, a second gate electrode over the second semiconductor layer, a second source electrode and a second drain electrode, wherein the second gate electrode is directly over the second semiconductor layer; a second protrusion extending from the second gate electrode along an edge of the second semiconductor layer; a gate line and a data line crossing each other in the display region to define a pixel region; a third TFT connected to the data line and the gate line in the display region, the third TFT including a third semiconductor layer, a third gate electrode over the third semiconductor layer, a third source electrode and a third drain electrode, wherein the third gate electrode is directly over the third semiconductor layer; a third protrusion extending from the third gate electrode along an edge of the third semiconductor layer; and a pixel electrode connected to the third drain electrode in the pixel region.

In another aspect of the present invention, a method of fabricating an array substrate for an LCD device includes forming first, second and third semiconductor layers on a substrate having a non-display region and a display region, the first and second semiconductor layers being formed in the non-display region, the third semiconductor layer being formed in the display region; forming a gate insulating layer on the first, second and third semiconductor layers; forming first, second and third gate electrodes and a gate line on the gate insulating layer, the first gate electrode directly over the first semiconductor layer, the second gate electrode directly over the second semiconductor layer, the third gate electrode directly over the third semiconductor layer, the gate line in the display region; forming a first protrusion extending from the first gate electrode along an edge of the first semiconductor layer, a second protrusion extending from the second gate electrode along an edge of the second semiconductor layer, a third protrusion extending from the third gate electrode along an edge of the third semiconductor layer; forming an interlayer insulating layer on the first, second and third gate electrode, the first, second and third protrusions and the gate line, the interlayer insulating layer having first and second contact holes exposing the first semiconductor layer, third and fourth contact holes exposing the second semiconductor layer, and fifth and sixth contact holes exposing the third semiconductor layer, respectively; forming first, second and third source electrodes, first, second and third drain electrodes and a data line on the interlayer insulating layer, wherein the first source electrode and the first drain electrode are connected to the first semiconductor layer through the first and second contact holes, and the second source electrode and the second drain electrode are connected to the second semiconductor layer through the third and fourth contact holes, and the third source electrode and the third drain electrode are connected to the third semiconductor layer through the fifth and sixth contact holes, respectively, and the data line crosses the gate line to define a pixel region in the display region; forming a passivation layer on the first, second and third source electrodes, the first, second and third drain electrodes and the data line, the passivation layer having a drain contact hole exposing the third drain electrode; and forming a pixel electrode on the passivation layer in the pixel region, the pixel electrode connected to the third drain electrode through the drain contact hole.

In another aspect of the present invention, a method of fabricating an array substrate for an LCD device includes forming first, second, third and fourth semiconductor layers on a substrate having non-display and display regions, the first and second semiconductor layers being formed in the non-display region, the third and fourth semiconductor layers being formed in the display region, the first semiconductor layer having an active region and an ohmic contact region at both sides of the active region, the second and third semiconductor layers having an active region, an ohmic contact region and an LDD region, wherein the LDD region is disposed at both sides of the active region, and the ohmic contact region is disposed at outer sides of the LDD region; doping the ohmic contact region of the second and third semiconductor layers and the fourth semiconductor layer with high concentration n-type impurities using a first photoresist pattern as a doping mask; forming a gate insulating layer on the first, second, third and fourth semiconductor layers; forming a first gate electrode corresponding to the active region of the first semiconductor layer on the gate insulating layer, a second gate electrode corresponding to the active region of the second semiconductor layer on the gate insulating layer, a third gate electrode corresponding to the active region of the third semiconductor layer on the gate insulating layer, a fourth gate electrode corresponding to the fourth semiconductor layer on the gate insulating layer and a gate line in the display region; doping the ohmic contact region of the first semiconductor layer with high concentration p-type impurities using a second photoresist pattern and the first gate electrode as a doping mask; doping the LDD region of the second and third semiconductor layers with low concentration n-type impurities using the first, second, third and fourth gate electrodes as a doping mask; forming an interlayer insulating layer on the first, second, third and fourth gate electrodes and the gate line, wherein the interlayer insulating layer has first and second contact holes exposing the first semiconductor layer, third and fourth contact holes exposing the second semiconductor layer, and fifth and sixth contact holes exposing the third semiconductor layer, respectively; forming first, second and third source electrodes, first, second and third drain electrodes and a data line on the interlayer insulating layer, wherein the first source electrode and the first drain electrode are connected to the first semiconductor layer through the first and second contact holes, and the second source electrode and the second drain electrode are connected to the second semiconductor layer through the third and fourth contact holes, and the third source electrode and the third drain electrode are connected to the third semiconductor layer through the fifth and sixth contact holes, respectively, and the data line crosses the gate line to define a pixel region in the display region; forming a passivation layer on the first, second and third source electrodes, the first, second and third drain electrodes and the data line, the passivation layer having a drain contact hole exposing the third drain electrode; and forming a pixel electrode on the passivation layer in the pixel region, the pixel electrode connected to the third drain electrode through the drain contact hole.

In another aspect of the present invention, a TFT for an LCD device includes a semiconductor layer; a gate insulating layer on the semiconductor layer; a gate electrode directly over the semiconductor layer on the gate insulating layer; a protrusion extending from the gate electrode along an edge of the semiconductor layer; an interlayer insulating layer on the gate electrode, the interlayer insulating layer having first and second contact holes exposing the semiconductor layer; and a source electrode and a drain electrode spaced apart from the source electrode on the interlayer insulating layer, the source and drain electrodes connected to the semiconductor layer through the first and second contact holes, respectively.

In another aspect of the present invention, a method of fabricating a TFT for an LCD includes forming a semiconductor layer; forming a gate insulating layer on the semiconductor layer; forming a gate electrode directly over the semiconductor layer on the insulating layer; forming a protrusion extending from the gate electrode along an edge of the semiconductor layer on the gate insulating layer; forming an interlayer insulating layer having first and second contact holes exposing the semiconductor layer on the gate electrode and the protrusion; and forming a source electrode and a drain electrode spaced apart form the source electrode on the interlayer insulating layer, the source and drain electrodes connected to the semiconductor layer through the first and second contact holes, respectively.

In another aspect of the present invention, an LCD device includes a first substrate having a display region and a non-display region at a periphery of the display region; a first TFT in the non-display region, the first TFT including a first semiconductor layer, a first gate electrode over the first semiconductor layer, a first source electrode and a first drain electrode, wherein the first gate electrode is directly over the first semiconductor layer; a first protrusion extending from the first gate electrode along an edge of the first semiconductor layer; a second TFT in the non-display region, the second TFT including a second semiconductor layer, a second gate electrode over the second semiconductor layer, a second source electrode and a second drain electrode, wherein the second gate electrode is directly over the second semiconductor layer; a second protrusion extending from the second gate electrode along an edge of the second semiconductor layer; a gate line and a data line crossing each other in the display region to define a pixel region; a third TFT connected to the data and gate lines in the display region, the third TFT including a third semiconductor layer, a third gate electrode over the third semiconductor layer, a third source electrode and a third drain electrode, wherein the third gate electrode is directly over the third semiconductor layer; a third protrusion extending from the third gate electrodes along an edge of the third semiconductor layer; a pixel electrode connected to the third drain electrode in the pixel region; a second substrate facing the first substrate; a color filter on the second substrate; a common electrode on the color filter; and a liquid crystal layer interposed between the pixel electrode and the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a portion of this specification, illustrate embodiments of the invention and together with the description serve to explain the principles of the invention. In the drawings.

DETAILED DESCRIPTION OF THE ILLUSTRATED EMBODIMENTS

Reference will now be made in detail to exemplary embodiments of the present invention, examples of which are illustrated in the accompanying drawings.

Figure 1:
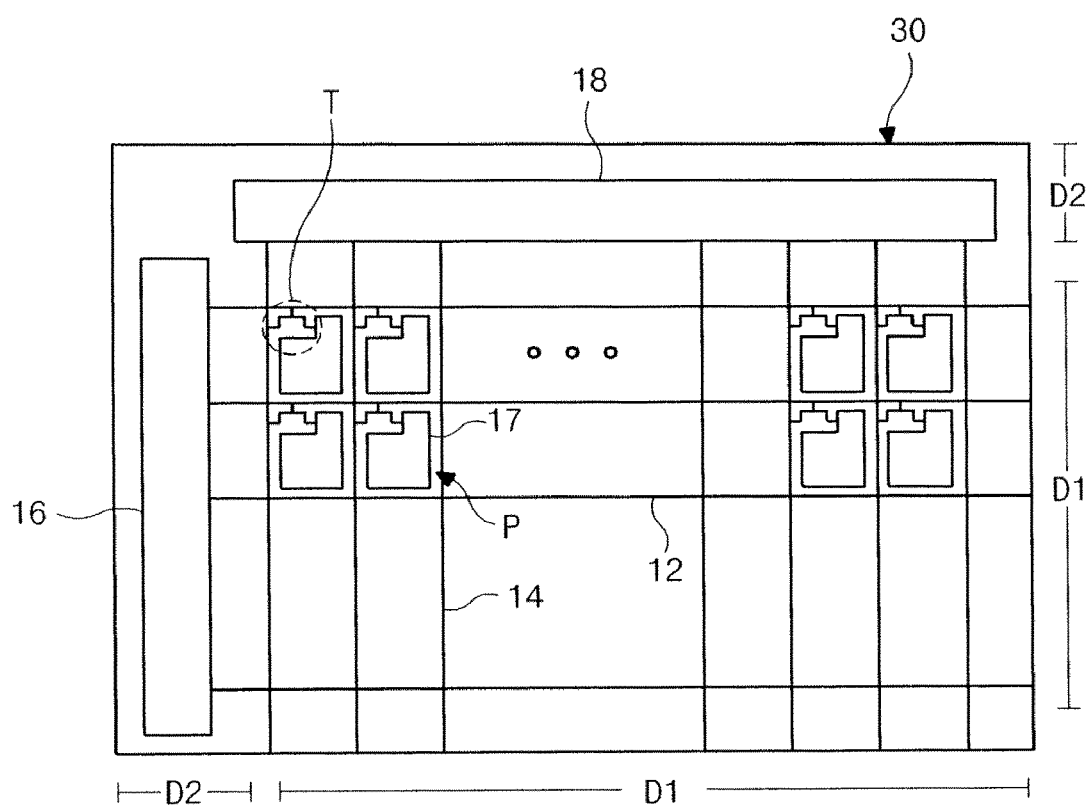
FIG. 1 is a schematic plan view of a liquid crystal panel according to the related art.
Figure 2:
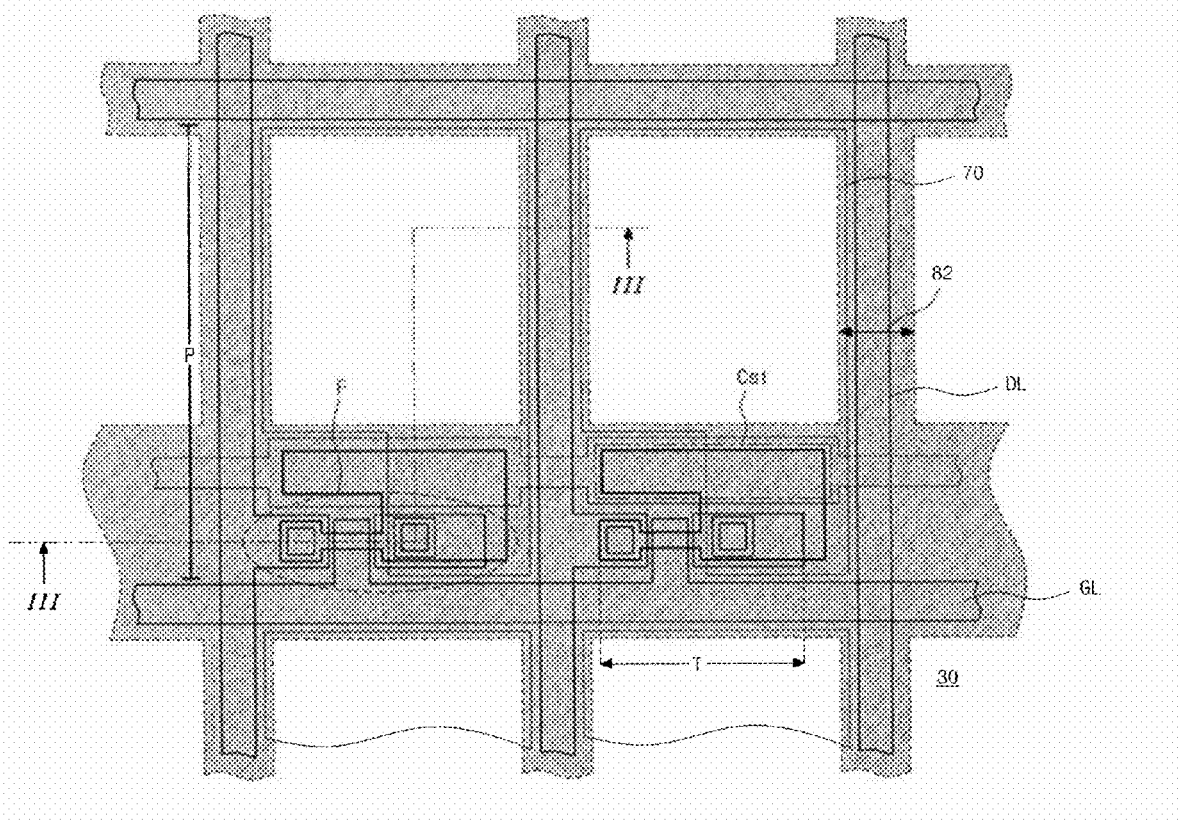
FIG. 2 is a plan view of an array substrate for an LCD device according to the related art.
Figure 3A:
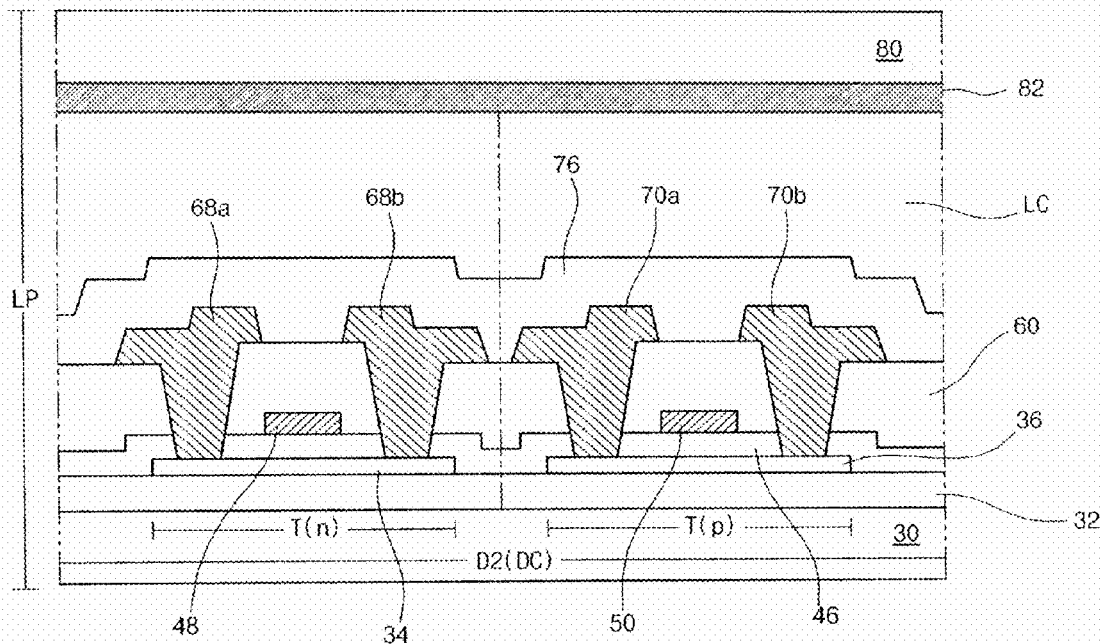
FIGS. 3A and 3B are cross-sectional views of a non-display region and a display region of an array substrate for an LCD device according to the related art.
Figure 3B:
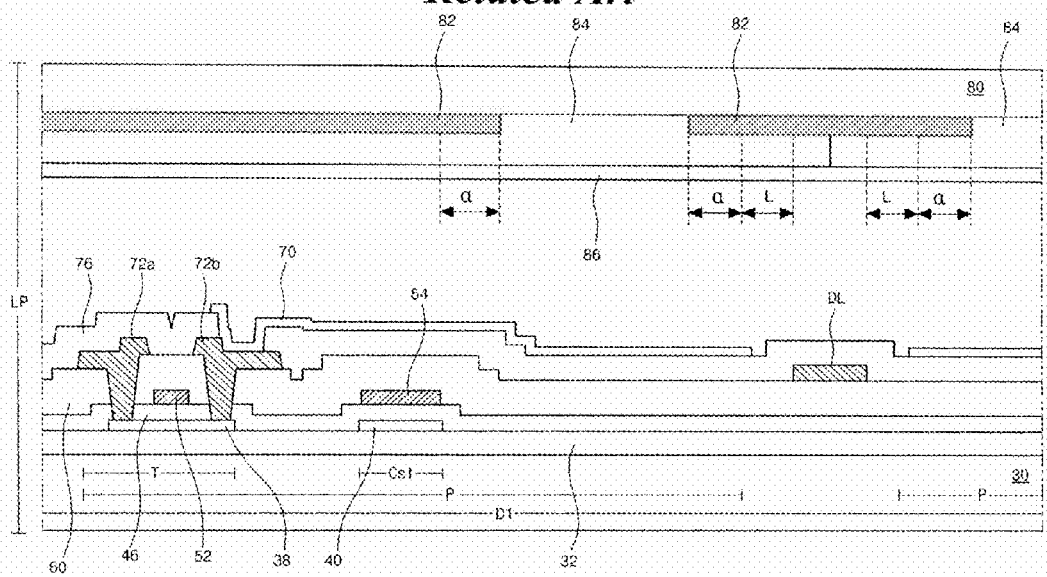
Figure 4A:
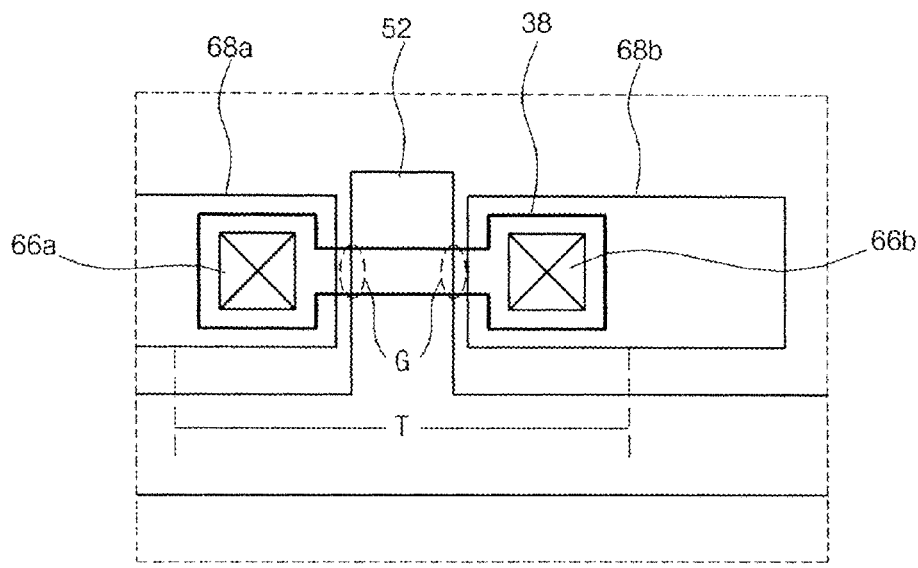
FIGS. 4A and 4B are enlarged plan and perspective views of a portion "F" of the FIG. 2.
Figure 4B:
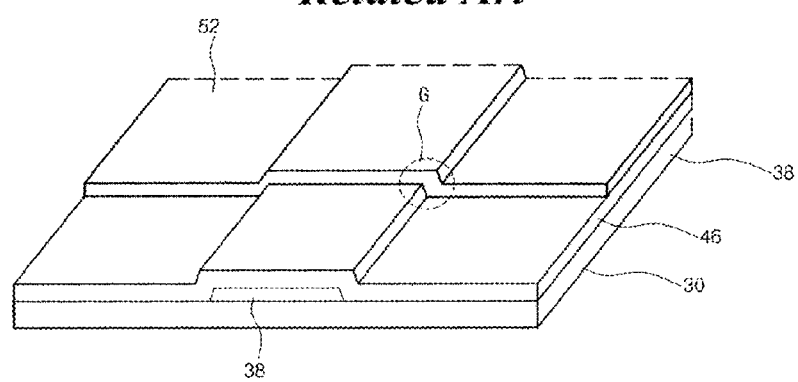
Figure 5A:
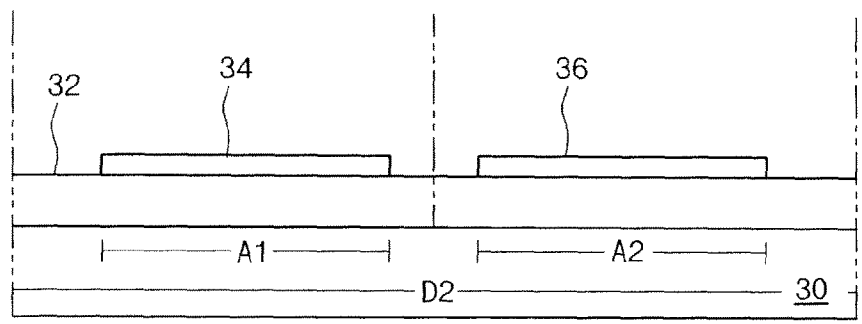
FIGS. 5A, 5B, 5C, 5D, 5E, 5F, 5G, 5H and 5I are cross-sectional views showing a process of fabricating an array substrate for an LCD device according to the related art.
Figure 5B:
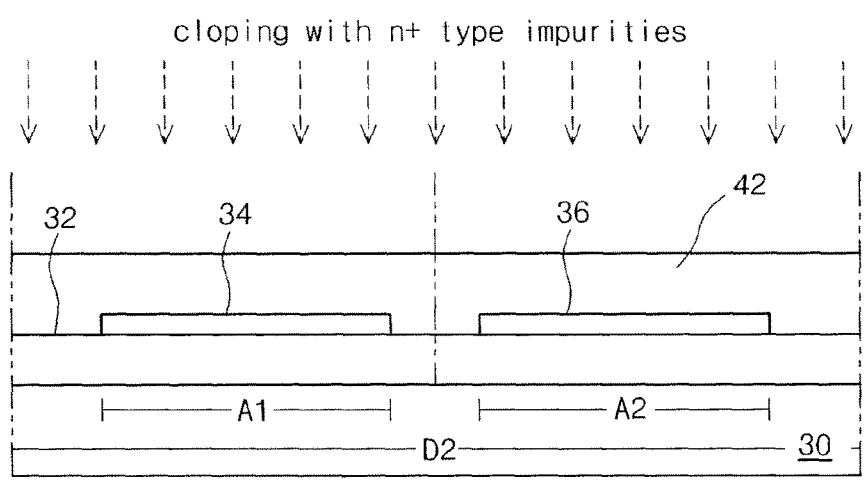
Figure 5C:
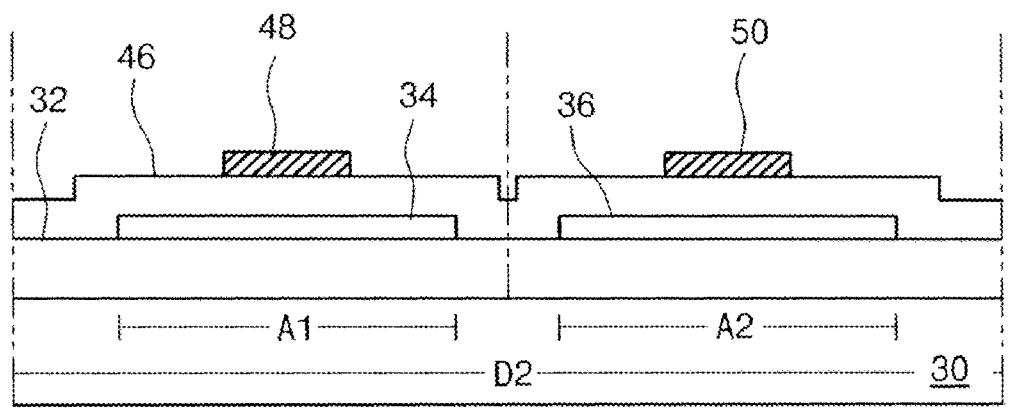
Figure 5D:
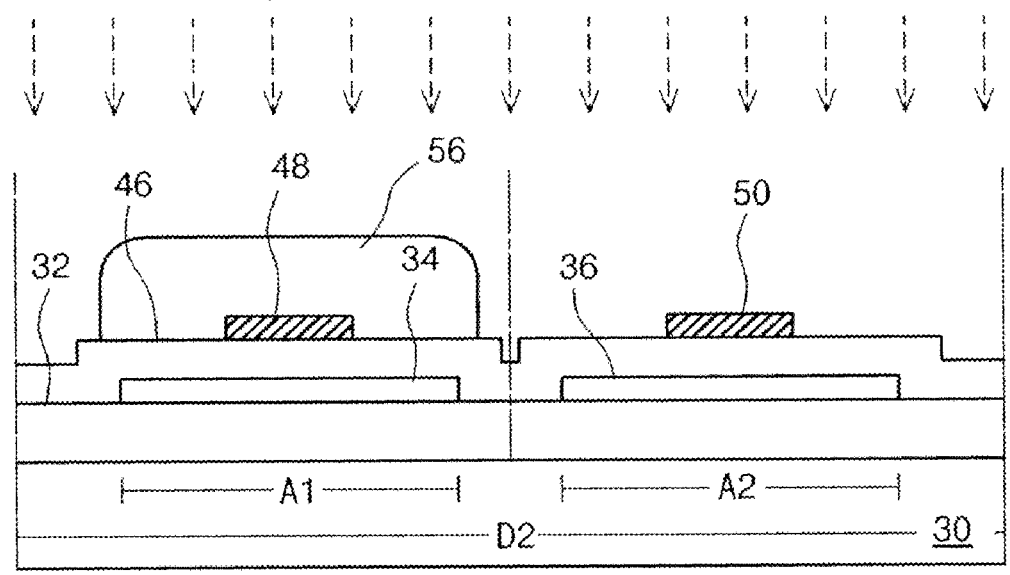
Figure 5E:
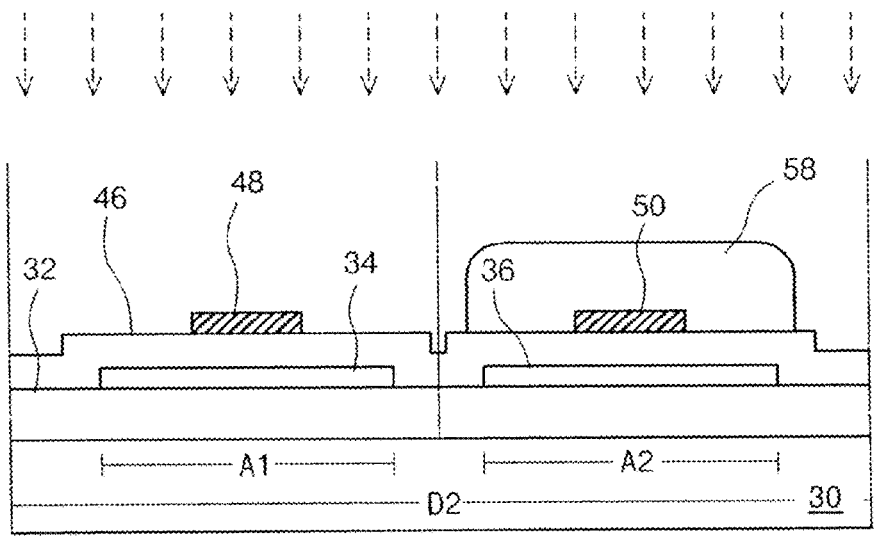
Figure 5F:
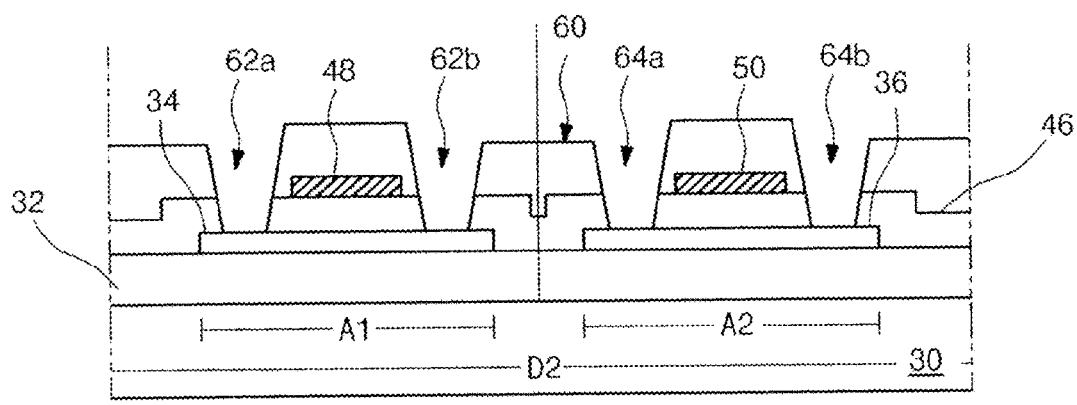
Figure 5G:
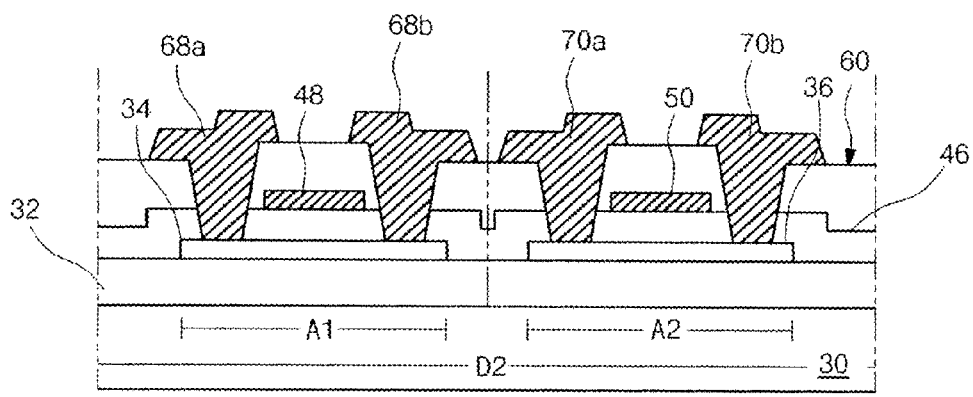
Figure 5H:
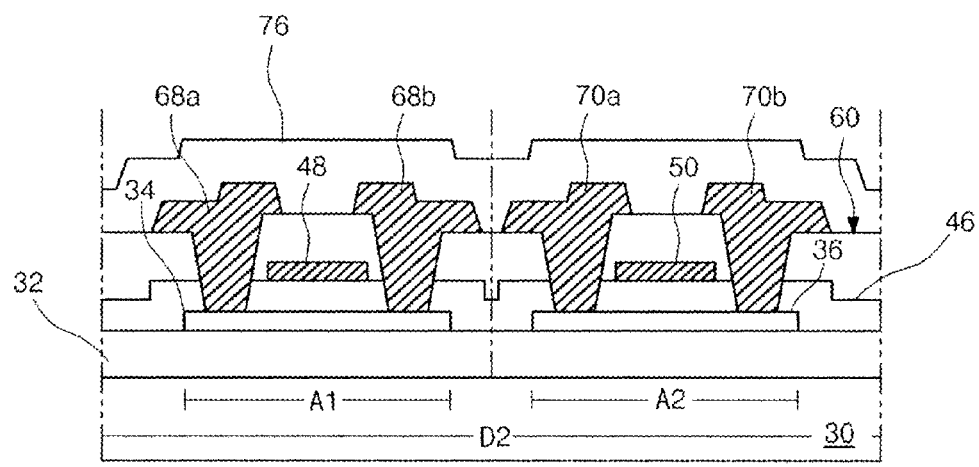
Figure 5I:
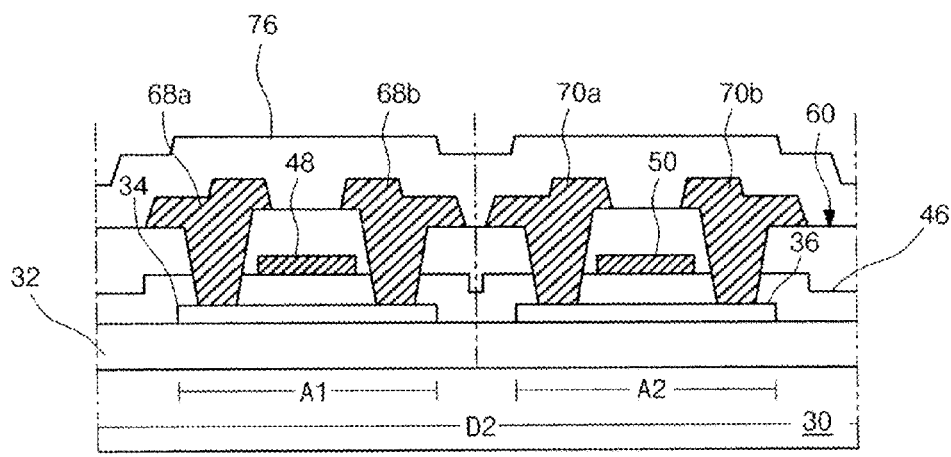
Figure 6A:
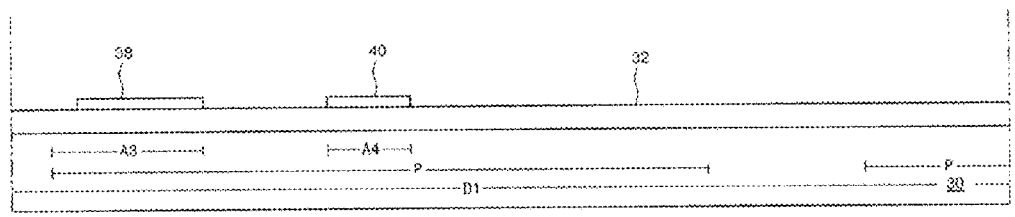
FIGS. 6A, 6B, 6C, 6D, 6E, 6F, 6G, 6H and 6I are cross-sectional views showing a process of fabricating an array substrate for an LCD device according to the related art.
Figure 6B:
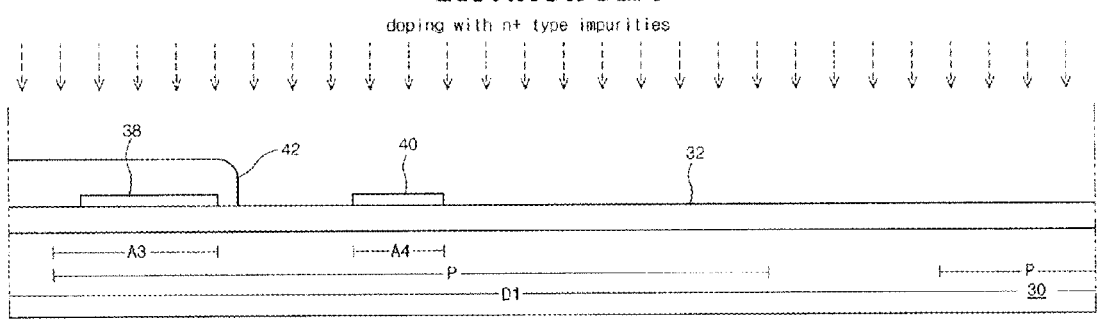
Figure 6C:
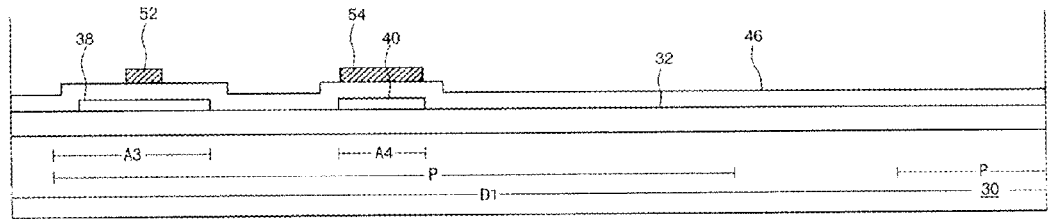
Figure 6D:
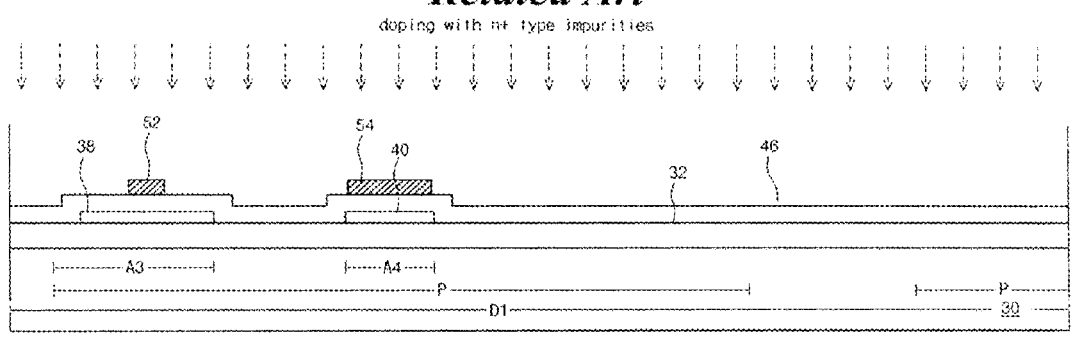
Figure 6E:
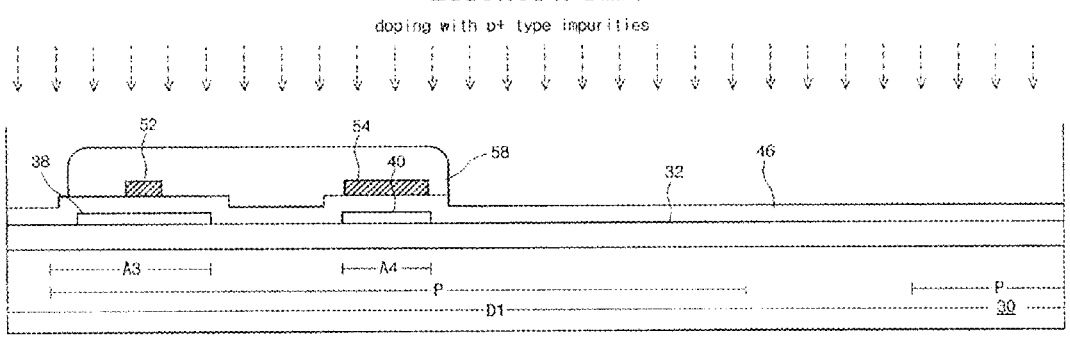
Figure 6F:
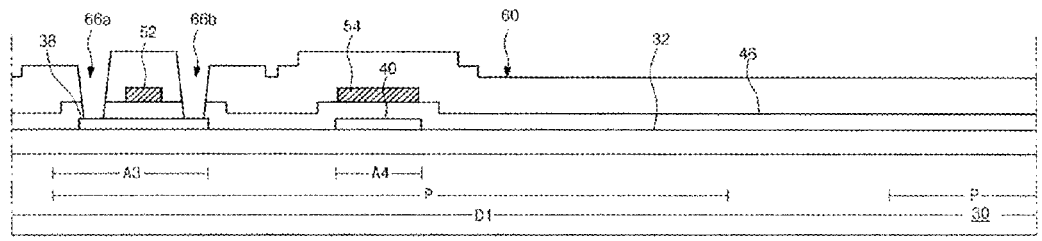
Figure 6G:
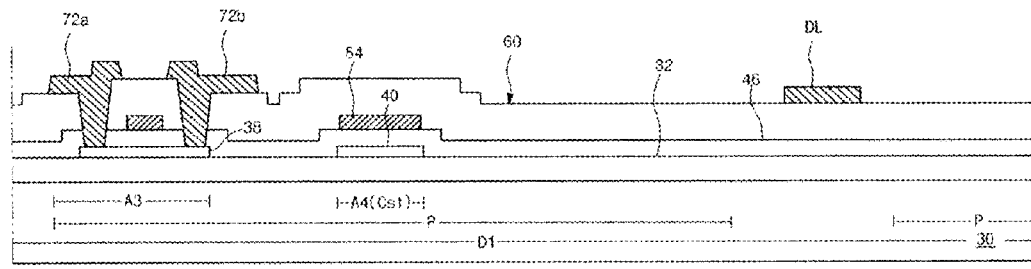
Figure 6H:
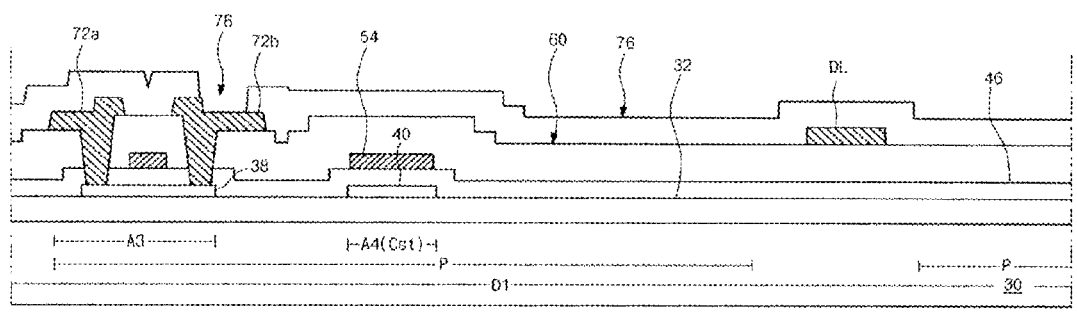
Figure 6I:
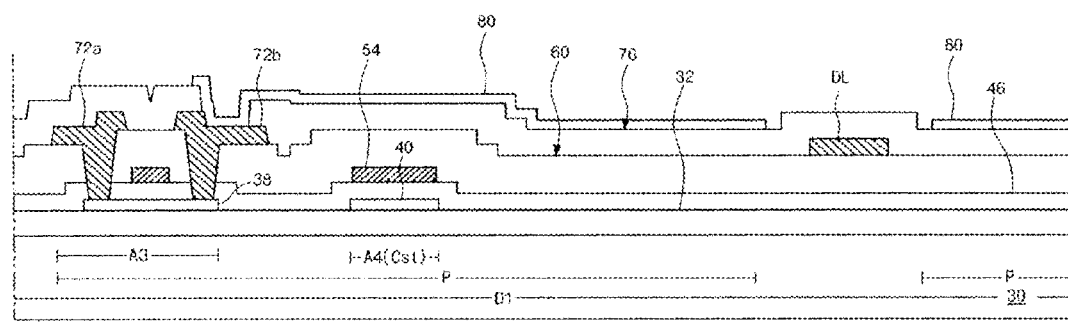
Figure 7:
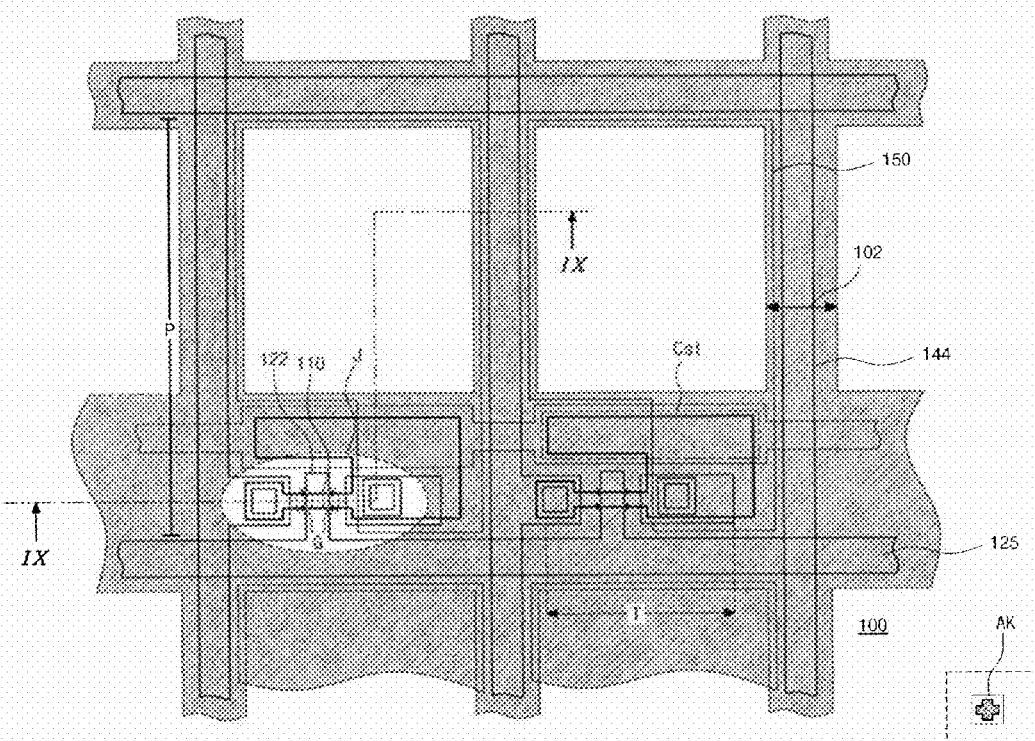
FIG. 7 is an enlarged plan view of an array substrate for an LCD device according to the present invention.
Figure 8A:
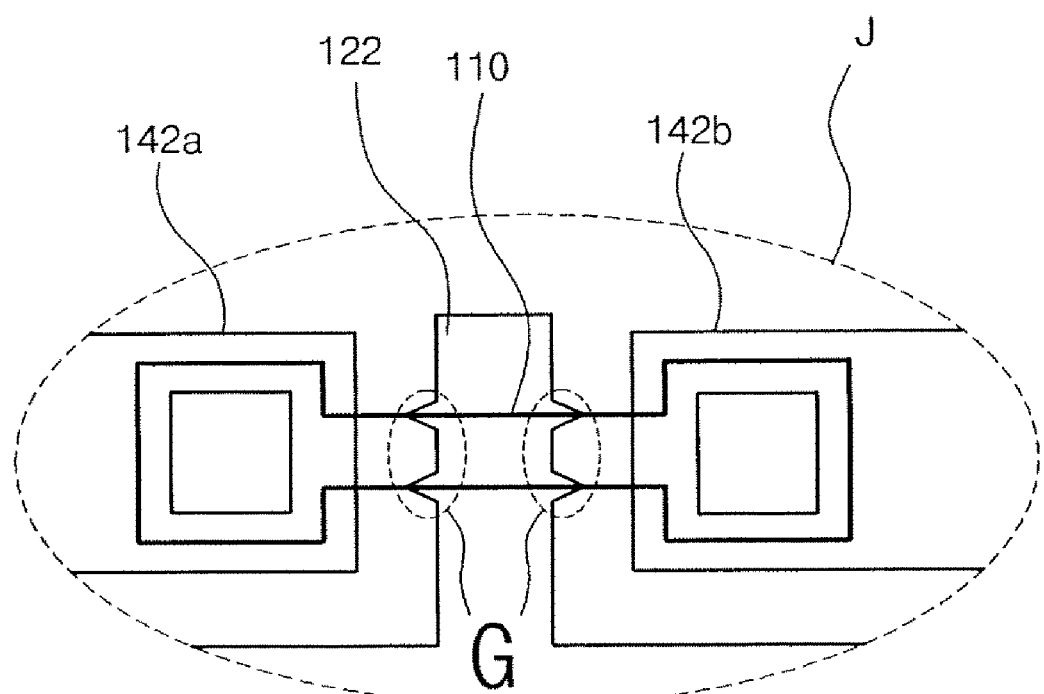
FIGS. 8A and 8B are enlarged plan and perspective views of a portion "J" of the FIG. 7.
Figure 8B:
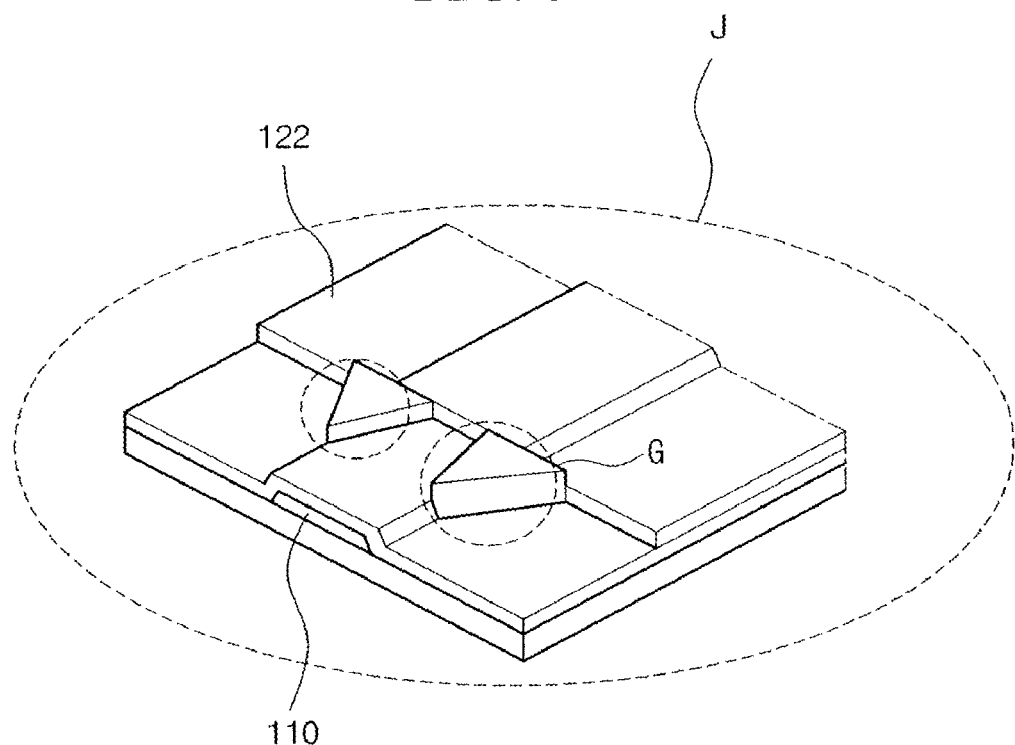

FIG. 7 is an enlarged plan view of an array substrate for an LCD device according to the present invention. FIGS. 8A and 8B are enlarged plan and perspective views of a portion "J" of the FIG. 7. As shown in FIG. 7 and FIGS. 8A and 8B, gate and data lines 125 and 144, a TFT T, a pixel electrode 150, a storage capacitor Cst, a black matrix 102 and an alignment key AK are formed on the first substrate 100. The black matrix 102 blocks light and is formed corresponding to a non-display region including the gate and data lines 125 and 144, the TFT T and the storage capacitor Cst on the first substrate 100. Simultaneously, the alignment key AK is formed at periphery of the first substrate 100. The alignment key AK is used for aligning a photoresist pattern and a gate electrode. The photoresist pattern and the gate electrode are formed at an accurate location using the alignment key AK. The gate and data lines 125 and 144 are formed on the black matrix 102 and cross each other to define a pixel region P. The TFT T, which may be made of polycrystalline silicon, includes a gate electrode 122 and a semiconductor layer of polycrystalline silicon. The TFT T is formed at a crossing portion of the gate and data lines 125 and 144. The storage capacitor Cst is formed at a region adjacent to the TFT T. The TFT T is used to apply a voltage to the pixel electrode 150 on the pixel region P.

When the gate electrode 122 is formed on the semiconductor layer 110, a protrusion G is formed at a crossing portion of the gate electrode 122 and the semiconductor layer 110. The protrusion G is formed in an area where a step difference results in the semiconductor layer 110. The protrusion G prevents the gate electrode 122 from being disconnected as a result of over etching performed at the portion of the step difference.

Figure 9A:
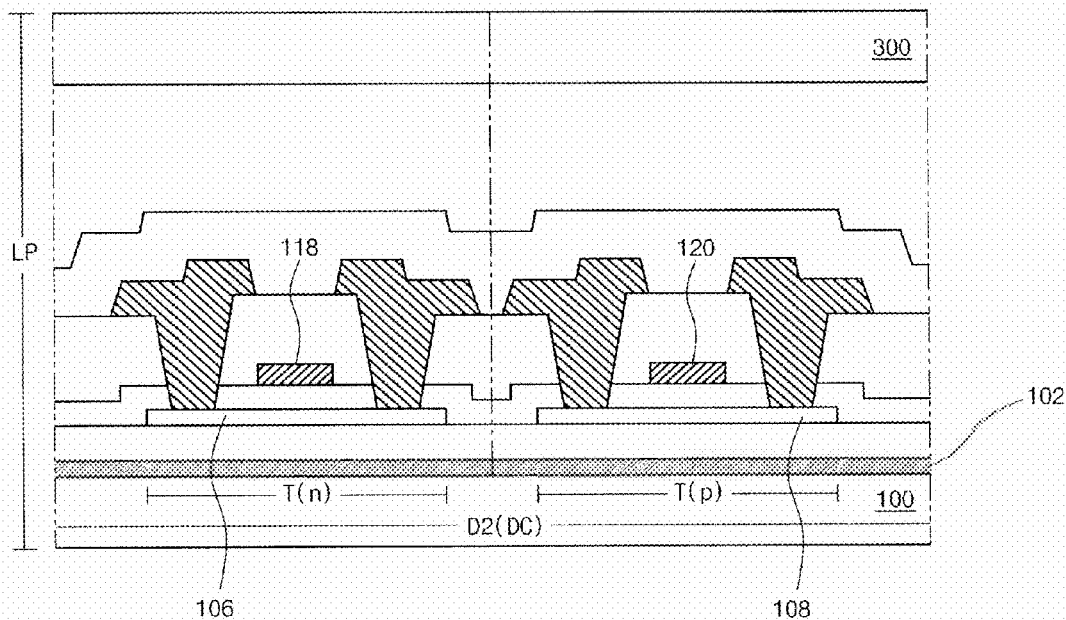
FIGS. 9A and 9B are schematic cross-sectional view of an LCD device having an integrated driving circuit according to the present invention.
Figure 9B:
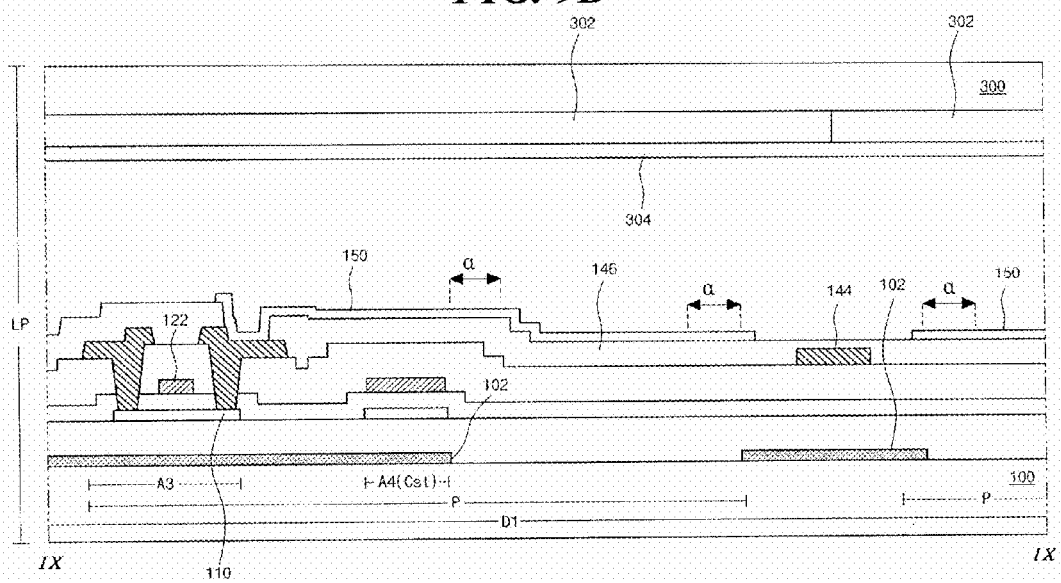

FIGS. 9A and 9B are schematic cross-sectional views of an LCD device having an integrated DC according to the present invention. FIG. 9A shows a CMOS structure, and FIG. 9B is a view taken along the line IX-IX of FIG. 7. As shown in FIGS. 9A and 9B, a liquid crystal panel LP of the LCD device having an integrated driving circuit according to the present invention includes a first substrate 100 and a second substrate 300. A common electrode 304 and a color filter 302 including red, green and blue sub-color filters corresponding to the pixel region P are formed on the second substrate 300. The common electrode 304 corresponding to the pixel electrode 150 is formed on an entire surface of the second substrate 300.

As mentioned above, the first substrate 100 includes a display region D1 and a non-display region D2. A driving circuit (DC) is formed in the non-display region D2 (DC). The DC has a CMOS structure including an n-type TFT T(n) and a p-type TFT T(p). In the display region D1, the TFT, the storage capacitor Cst and the pixel electrode 150 are formed. The TFT T may be made of polycrystalline silicon and is used as a switching element. The gate line 125 is formed along a direction of the pixel region P, and the data line 144 is formed along another direction of the pixel region P.

Unlike the related art, the LCD device according to the present invention includes the black matrix 102 on the first substrate 100. Accordingly, the black matrix 102 on the first substrate 100 does not require the margin α, and thus, the LCD device according to the present invention has a high aperture ratio.

FIGS. 10A to 10J and FIGS. 11A to 11J are cross-sectional views showing a process of fabricating an array substrate for an LCD device having an integrated DC according to the present invention. FIGS. 10A to 10J show a process of fabricating a driving circuit, and FIGS. 11A to 11J show a process of a pixel region.

Figure 10A:
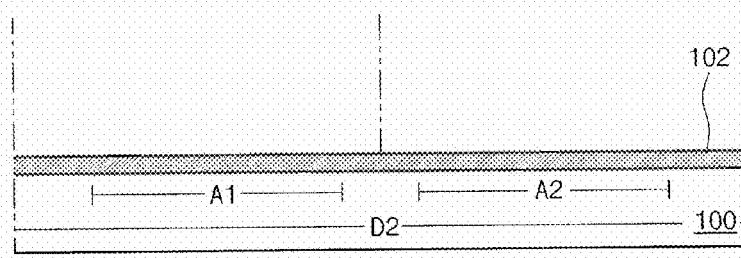
FIGS. 10A, 10B, 10C, 10D, 10E, 10F, 10G, 10H, 10I and 10J are cross-sectional views showing a process of fabricating an array substrate for an LCD device having an integrated driving circuit according to the present invention.
Figure 11A:
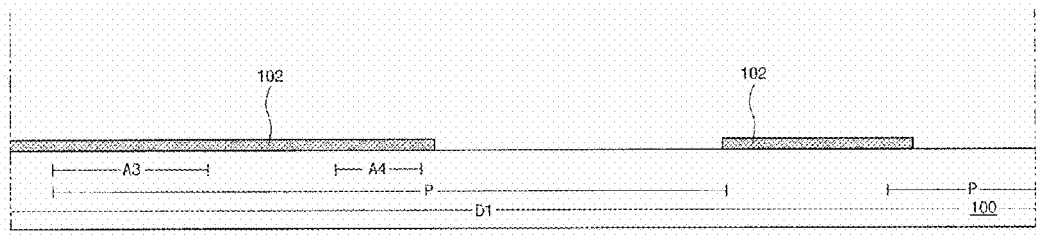
FIGS. 11A, 11B, 11C, 11D, 11E, 11F, 11G, 11H, 11I and 11J are cross-sectional views showing a process of fabricating an array substrate for an LCD device having an integrated driving circuit according to the present invention.

FIGS. 10A and 11A show a first mask process. As shown in FIGS. 10A and 11A, the display region D1 and the non-display region D2 having a first region A1 and a second region A2 are defined on the first substrate 100. The pixel region P having a switching region A3 and a storage region A4 and A4 (Cst) is defined in the display region D1. The black matrix 102 is formed on the first substrate 100 by depositing and patterning a metal using a first patterning mask. The black matrix 102 covers the non-display region D2, the switching region A3, the storage region A4, and a region surrounding the pixel region P. Simultaneously, the alignment key AK is formed on the first substrate 100.

Figure 10B:
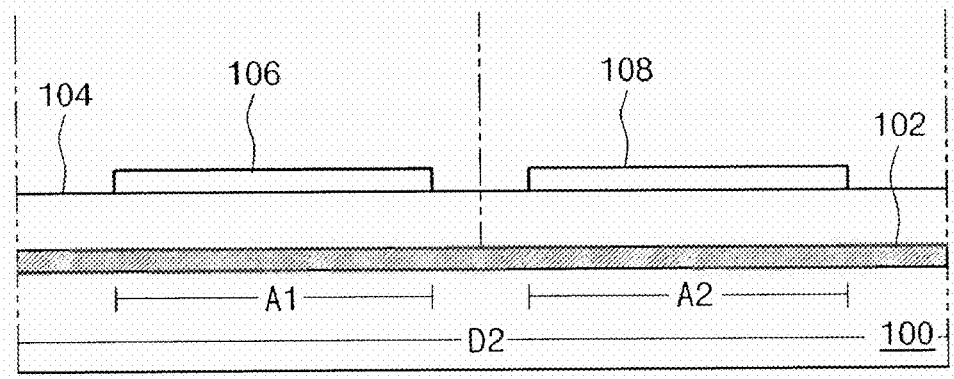
Figure 11B:
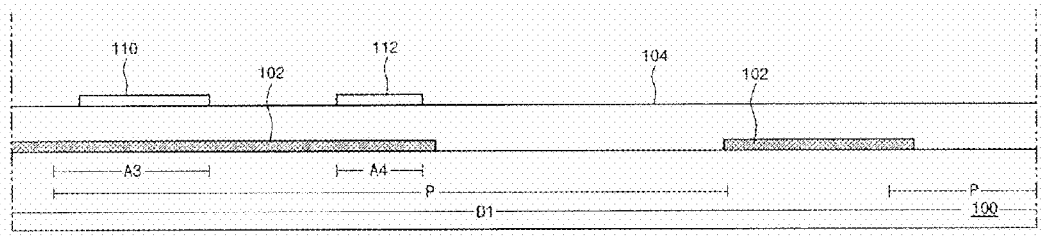

FIGS. 10B and 11B show a second mask process. As shown in FIGS. 10B and 11B, a buffer layer 104 is formed on an entire surface of the first substrate 100 including the black matrix 102 and the alignment key AK by depositing an insulating material. Next, an amorphous silicon layer may be formed on the buffer layer 104 by depositing amorphous silicon, and then a process of crystallizing the amorphous silicon layer into a polycrystalline silicon layer is performed. The crystallization of the amorphous may be performed using laser. Then, first, second, third and fourth semiconductor layers 106, 108, 110 and 112 are formed on the buffer layer 104 by patterning using a second patterning mask. The first, second and third semiconductor layers 106, 108 and 110 in the first region A1, the second region A2 and the switching region A3, respectively, are an active layer, and the fourth semiconductor layer 112 in the storage region A4 is an electrode.

Figure 10C:
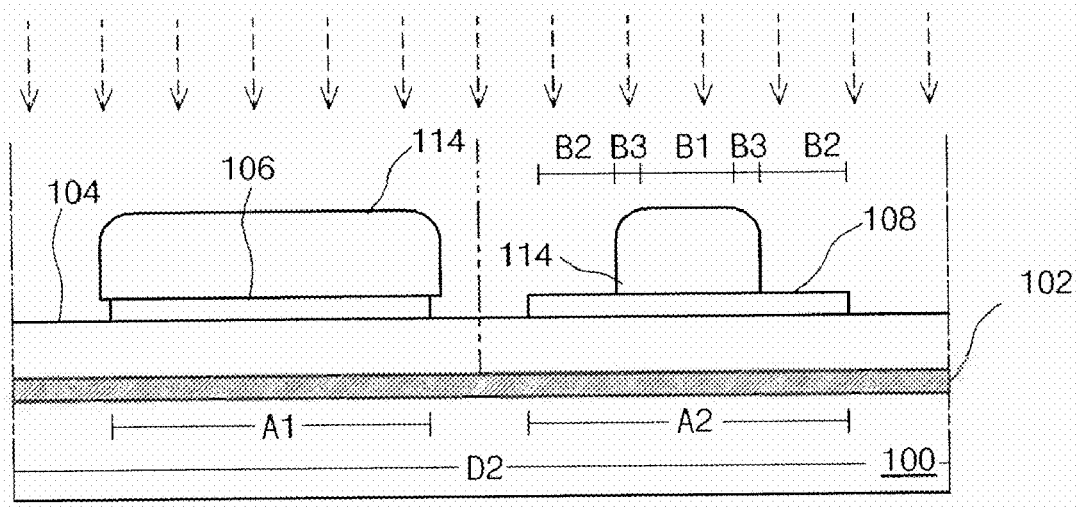
Figure 11C:
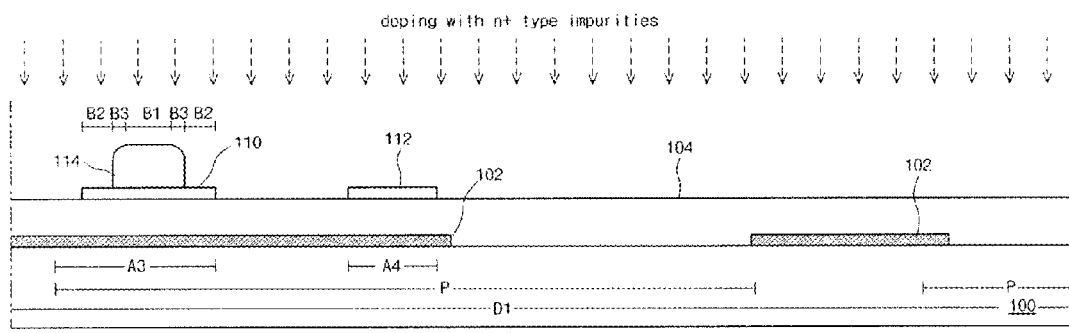

FIGS. 10C and 11C show a third mask process. As shown in FIGS. 10C and 11C, a photoresist is coated on the entire surface of the first substrate 100 including the first, second, third and fourth semiconductor layers 106, 108, 110 and 112. A photoresist pattern 114 is formed on the semiconductor layers 106, 108, 110 and 112 by patterning the photoresist using a third patterning mask. The photoresist pattern 114 covers the first semiconductor layer 106 and parts of the second and third semiconductor layers 108 and 110. The second semiconductor layer 108 in the second region A2 and the third semiconductor layer 110 in the switching region A3 are divided into three regions, respectively, and the three regions are defined as an active region B1, a lightly doped drain (LDD) region B3 and an ohmic contact region B2. The active region B1 corresponds to a center portion of the second and third semiconductor layers 108 and 110, and the LDD region B3 is disposed at the both sides of the active region B1. The ohmic contact region B2 is disposed at outer sides of the LDD region B2. A purpose in forming the photoresist pattern 114 is to cover the active and LDD region B1 and B3.

Next, n+ type impurities are doped on the entire surface of the first substrate 100 including The photoresist pattern 114. The n+ type impurities are doped into the ohmic contact region B2 in the second region A2 and the switching region A3. Accordingly, the fourth semiconductor layer 112 in the storage region A4 is redefined as a first storage electrode 112. Then, the photoresist pattern 114 is removed from the first substrate 100.

Figure 10D:
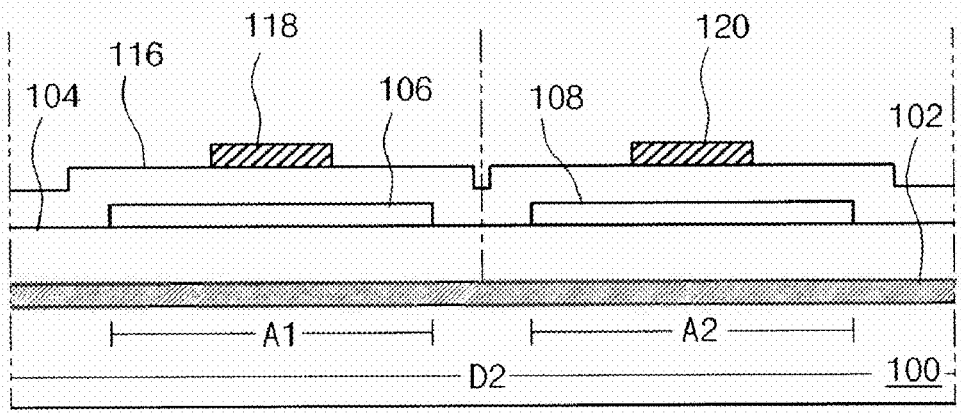
Figure 11D:
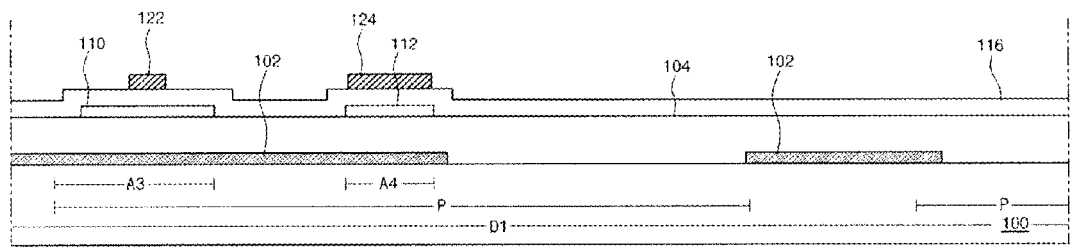

FIGS. 10D and 11D show a fourth mask process. As shown in FIGS. 10D and 11D, a gate insulating layer 116 is formed on the entire surface of the first substrate 100 by depositing an inorganic insulating material such as silicon nitride or silicon oxide. The gate insulating layer 116 is formed on the first substrate 100, the semiconductor layers 106, 108 and 110 and the first storage electrode 112. This enables the gate insulating layer 116 to have a step difference corresponding to a height of the semiconductor layers 106, 108 and 110 and the first storage electrode 112. Sequentially, first, second and third gate electrodes 118, 120 and 122 and a second storage electrode 124 are formed on the gate insulating layer 116 by depositing and patterning a conductive metal using a fourth patterning mask. The first, second and third gate electrodes 118, 120 and 122 are formed corresponding to the center of the first, second and third semiconductor layer 106, 108 and 110. The second storage electrode 124 is formed corresponding to the first storage electrode 112. The second and third gate electrodes are formed corresponding to the active region B1 of the first and third semiconductor layers 108 and 110. The first, second and third gate electrodes 118, 120 and 122 have a smaller size than the first, second and third semiconductor layer 106, 108 and 110, and the second storage electrode 124 has substantially the same size as the first storage electrode 112. Simultaneously, the gate line 125 is formed along a direction of the pixel region P. Also, when the gate electrodes 118, 120 and 122 and the second storage electrode 124 are formed on the gate insulating layer 116, the protrusion G is formed at a crossing portion of the first, second and third gate electrodes 118, 120 and 122 and the first, second and third semiconductor layer 106, 108 and 110. The protrusion may have a triangle shape. The protrusion prevents the etchant, which is used for forming the gate electrodes 118, 120 and 122, from pooling at the crossing portion having the step difference. Accordingly, the gate electrodes 118, 120 and 122 do not become disconnected due to overetching. Thus, a problem of the related art is resolved.

Figure 10E:
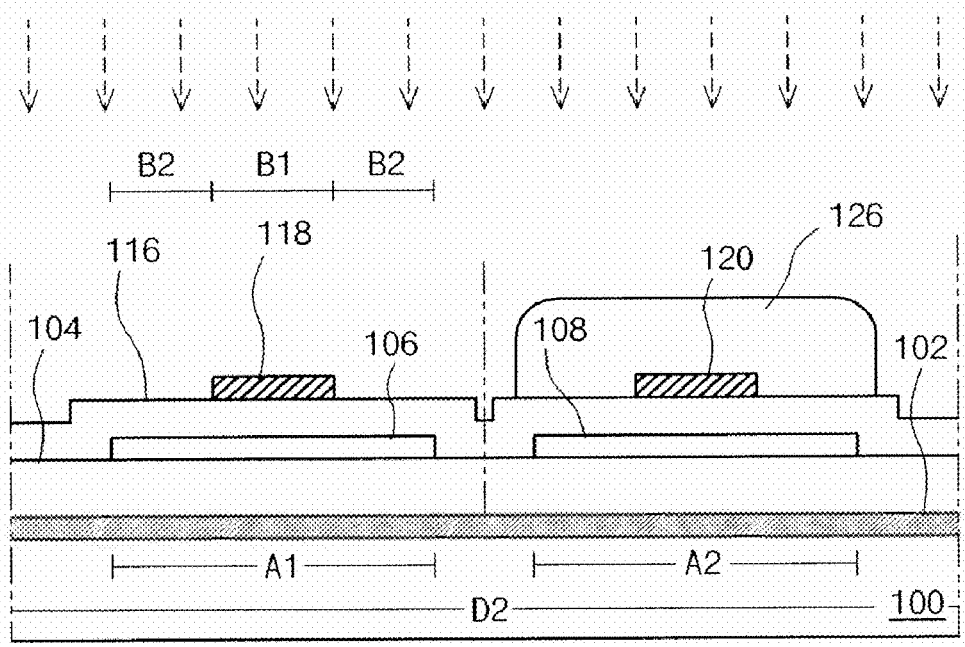
Figure 11E:
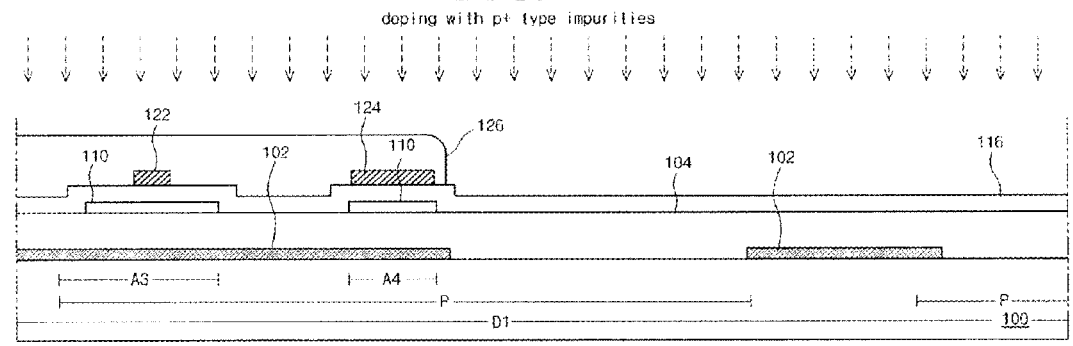

FIGS. 10E and 11E show a fifth mask process. As shown in FIGS. 10E and 11E, a photoresist pattern 126 is formed on the gate electrodes 118, 120 and 122 and the gate insulating layer 116 by coating and patterning the photoresist. To pattern the photoresist, a fifth pattering mask is used. The photoresist pattern 126 covers the second, switching and storage regions A2, A3 and A4 and exposes the first region A1. Then, a p+ type impurities are doped into the first region A1 using the first gate electrode 118 as a doping mask such that both ends of the first semiconductor layer 106 have ohmic contact characteristics. Both ends of the first semiconductor layer 106 are defined as ohmic contact regions B2. The active region B1 is defined in a region between ohmic contact regions B2. The photoresist pattern 126 is removed from the first substrate 100.

Figure 10F:
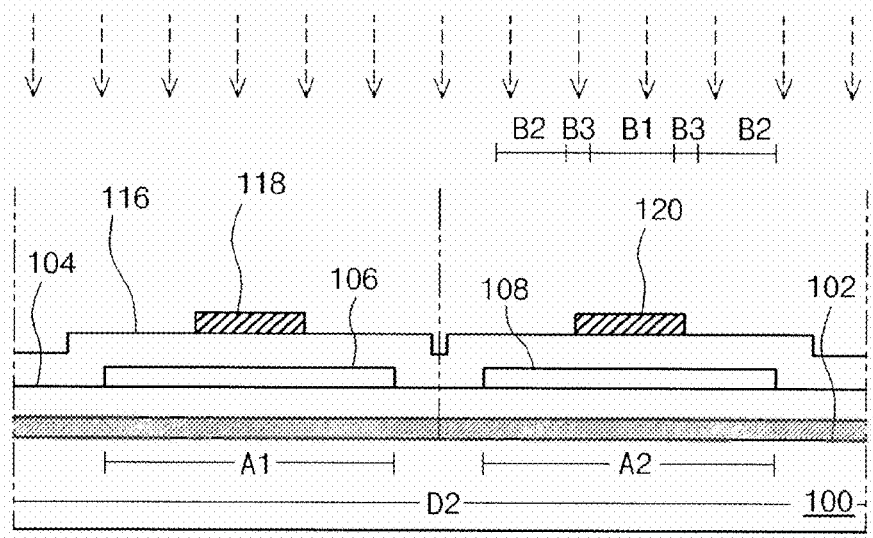
Figure 11F:
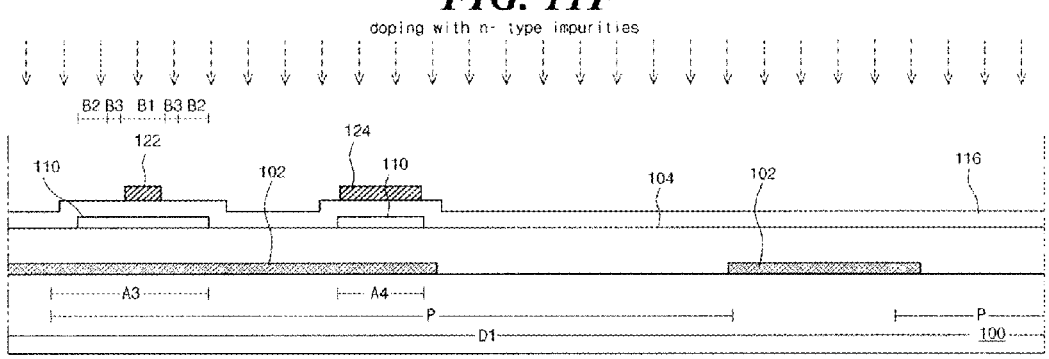

FIGS. 10F and 11F show a process of forming a LDD region on second and third semiconductor layers 106 and 108. After the photoresist pattern 126 is removed, n− type impurities may be doped into the entire surface of the first substrate 100. The n-type impurities are doped into the LDD region B3 of the second and switching regions A2 and A3 using the second and third gate electrodes 120 and 122 as doping masks, such that the LDD region B3 is formed in the second and switching regions A2 and A3. The LDD region minimizes leakage current of the TFT. The n− type impurities are doped into the ohmic contact region B2 of the first, second third semiconductor layers 104, 106 and 108. However, since n+ or p+ type impurities of a greater amount than the n− type impurities have been doped into the ohmic contact regions B2 of the first, second third semiconductor layers 104, 106 and 108, n− type impurities do not affect their characteristics.

Figure 10G:
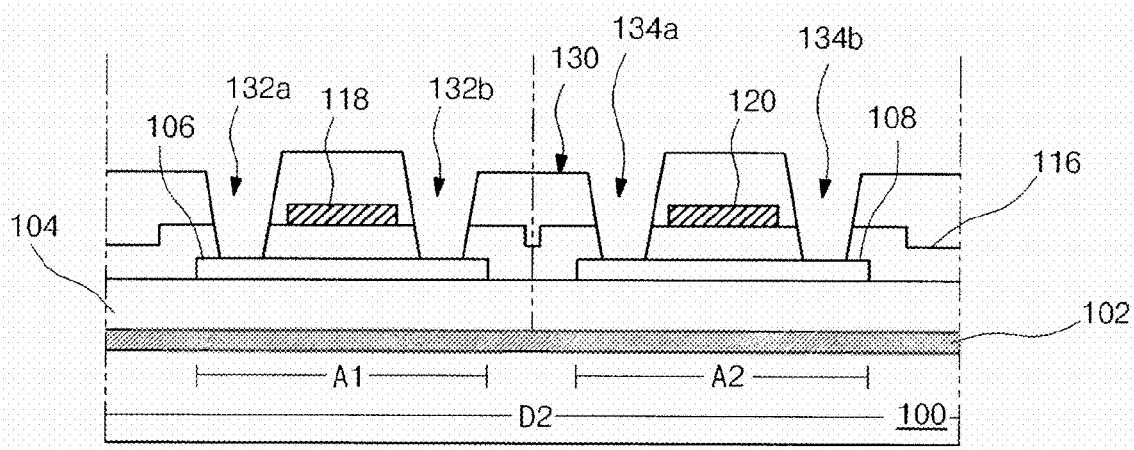
Figure 11G:
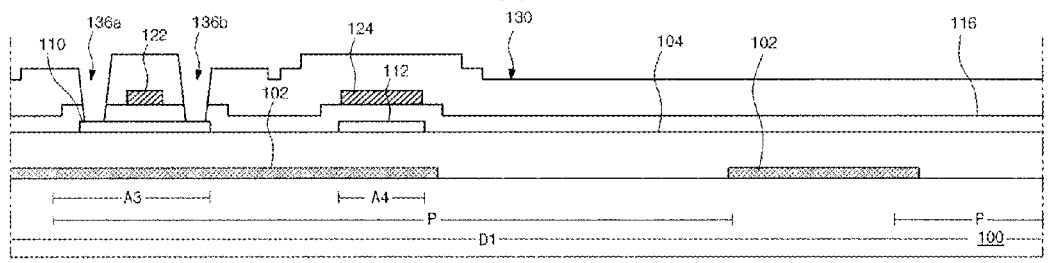

FIGS. 10G and 11G show a sixth mask process. As shown in FIGS. 10G and 11G, a interlayer insulating layer 130 is formed on the first substrate 100 by depositing and pattering an inorganic insulating material, such as silicon nitride and silicon oxide. The interlayer insulating layer 130 is patterned using a sixth patterning mask (not shown) to form first contact holes 132a, 134a and 136a and second contact holes 132b, 134b and 136b. The first contact holes 132a, 134a and 136a and second contact holes 132b, 134b and 136b are formed through the interlayer insulating layer 130 and the gate insulating layer 116 in the first, second and switching regions A1, A2 and A3. The first contact holes 132a, 134a and 136a and the second contact holes 132b, 134b and 136b expose ohmic contact regions B2 of the first, second and third semiconductor layers 104, 106 and 108, respectively.

Figure 10H:
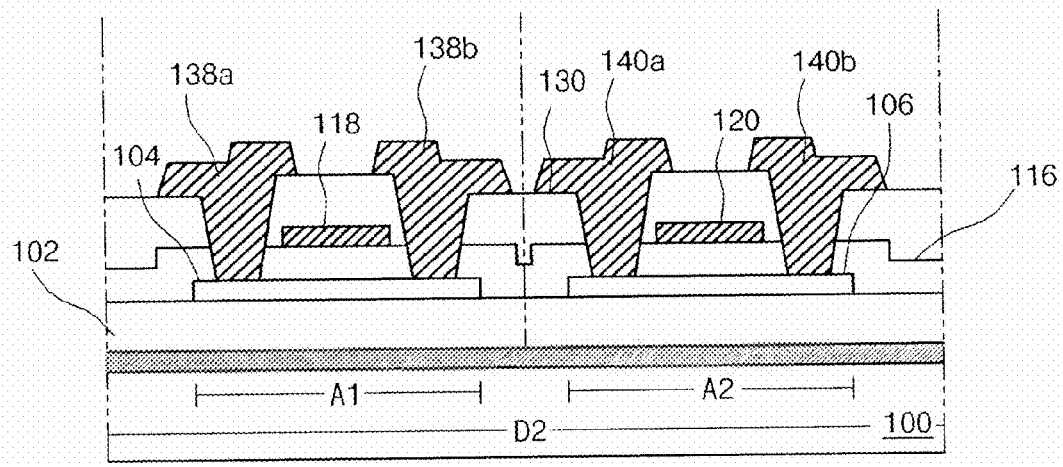
Figure 11H:
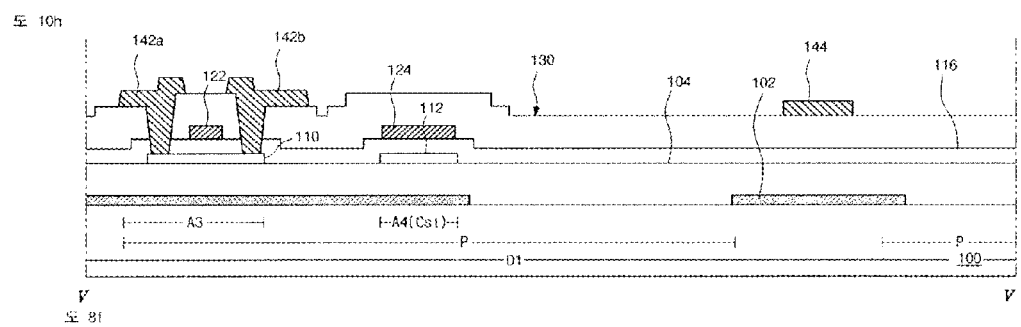

FIGS. 10H and 11H show a seventh mask process. As shown in FIGS. 10H and 11H, source electrodes 138a, 140a and 142a and drain electrodes 138b, 140b and 142b are formed on the first substrate 100 by depositing and pattering a conductive metal using a seventh patterning mask. The conductive metal may include chrome, molybdenum, tungsten, copper, aluminum alloy, etc. The source electrodes 138a, 140a and 142a and the drain electrodes 138b, 140b and 142b contact the ohmic contact regions B2 through the first contact holes 132a, 134a and 136a and the second contact holes 132b, 134b and 136b, respectively. Simultaneously, the data line 144 is formed along another direction of the pixel region P.

Through the above-mentioned process, the CMOS structure including the p-type and n-type TFTs made of polycrystalline silicon is formed in the non-display region. Also, the n-type TFT made of polycrystalline is formed in the switching region, and the storage capacitor including the first and second storage electrode is formed in the storage region.

Figure 10I:
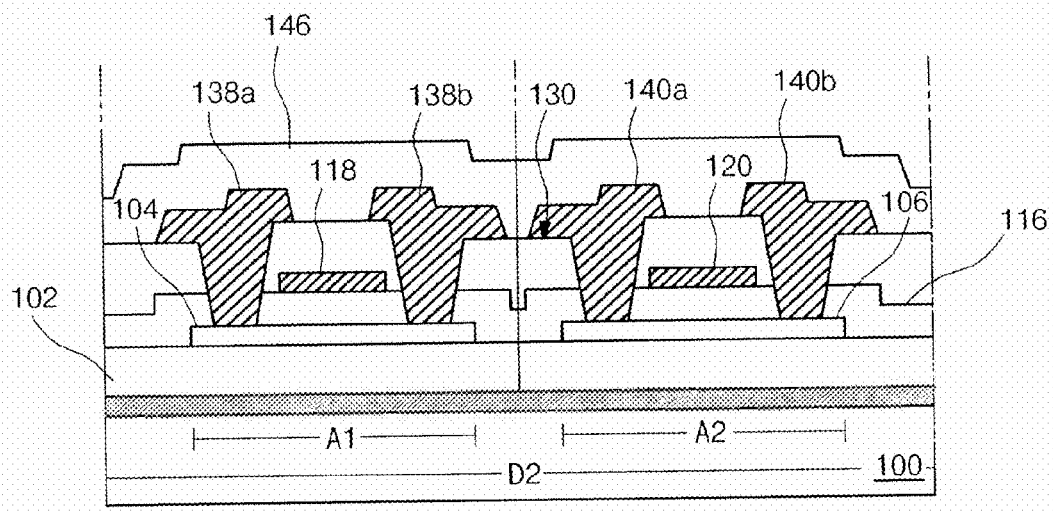
Figure 11I:
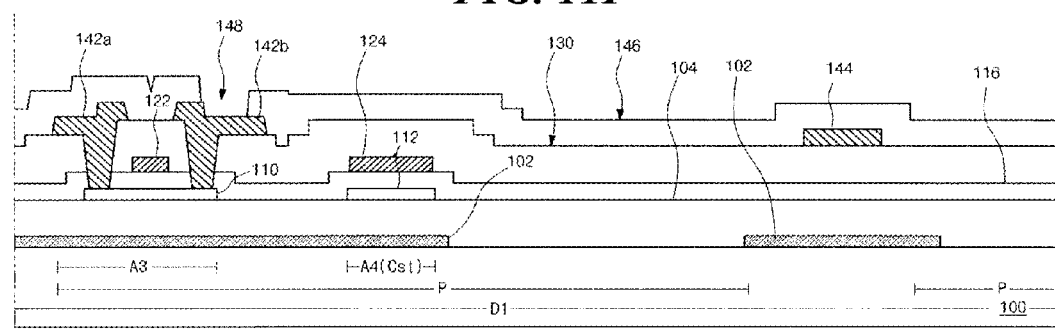

FIGS. 10I and 11I show an eighth mask process. As shown in FIGS. 10I and 11I, a passivation layer 146 is formed on the entire surface of the first substrate 100 by depositing an insulating material. Then, a drain contact hole 148 is formed through the passivation layer 146 by patterning the passivation layer 146 using an eighth patterning mask. The drain contact hole 148 exposes the drain electrode 142b in the switching region A3.

Figure 10J:
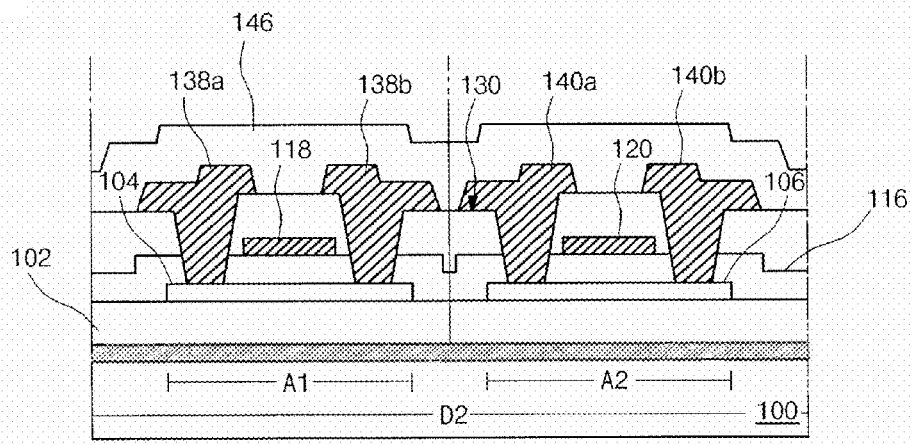
Figure 11J:
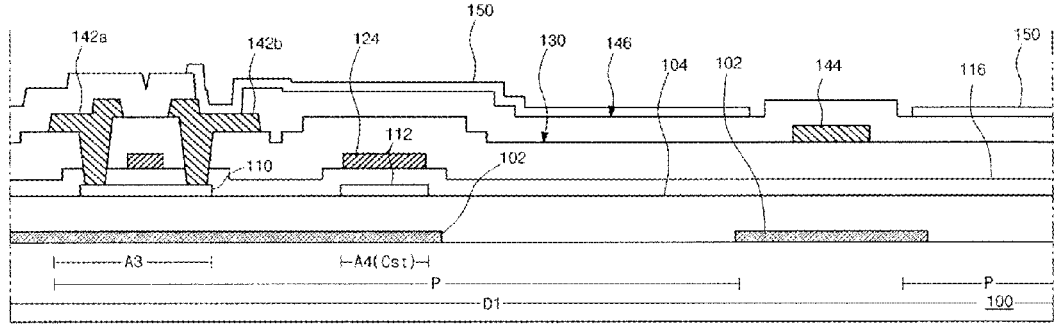

FIGS. 10J and 11J show a ninth mask process. As shown in FIGS. 10J and 11J, the pixel electrode 150 is formed on the passivation layer 146 in the pixel region P by depositing and patterning a transparent conductive metal using a ninth patterning mask. The transparent conductive metal may include indium-tin-oxide (ITO) or indium-zinc-oxide (IZO). The pixel electrode 150 contacts the drain electrode 142b through the drain contact hole 148.

Through the above-mentioned process, the array substrate for the LCD device according to the present invention has been manufactured. Because the doping processes of forming the n-type TFT made of polycrystalline silicon and the electrode of the storage capacitor are performed at the same time, the number of processes in fabrication of the array substrate decreases.

The LCD device is formed using the array substrate according to the present invention and the color filter substrate. The color filter substrate includes a color filter layer including red, green and blue sub-color filters and a common electrode. Unlike the color filter substrate according to the related art, the color filter substrate according to the present invention does not include the black matrix. The LCD device is manufactured by attaching the array substrate and the color filter substrate and forming a liquid crystal layer therebetween.

It will be apparent to those skilled in the art that various modifications and variations can be made in the present invention without departing from the sprit or scope of the invention. Thus, it is intended that the present invention cover the modifications and variations of this invention provided they come within the scope of the appended claims and their equivalents.

What is claimed is:

1. A TFT for an LCD device, comprising:
a semiconductor layer;
a gate insulating layer on the semiconductor layer;
a gate electrode directly over the semiconductor layer on the gate insulating layer;
first to fourth protrusions extending from the gate electrode along an edge of the semiconductor layer;
an interlayer insulating layer on the gate electrode, the interlayer insulating layer having first and second contact holes exposing the semiconductor layer; and
a source electrode and a drain electrode spaced apart from the source electrode on the interlayer insulating layer, the source and drain electrodes connected to the semiconductor layer through the first and second contact holes, respectively,
wherein the gate electrode has first and second sides opposite to each other, and wherein the first and second protrusions are disposed at the first side, and the third and fourth protrusions are disposed at the second side,
wherein the first and second protrusions are disposed at two crossing portions of the gate electrode and the semiconductor layer, respectively, and spaced apart from each other, and the third and fourth protrusions are disposed at the other two crossing portions of the gate electrode and the semiconductor layer, respectively, and spaced apart from each other,
wherein the first and second protrusions protrude toward the source electrode, and the third and fourth protrusions protrude toward the drain electrode,
wherein each of the first to fourth protrusions has a triangle shape at a crossing point of the gate electrode and the semiconductor layer.

2. The TFT according to claim 1, wherein the semiconductor layer includes an active region, an LDD region and an ohmic contact region, the LDD region is disposed at both sides of the active region and the ohmic contact region is disposed at outer sides of the LDD region.

3. The TFT according to claim 2, wherein the ohmic contact region is doped with high concentration impurities, and the LDD region is doped with low concentration impurities.

4. The TFT according to claim 1, wherein the semiconductor layer includes an active region and an ohmic contact region at both sides of the active region.

5. The TFT according to claim 4, wherein the ohmic contact region is doped with one of p-type impurities and n-type impurities.

6. The TFT according to claim 1, wherein the semiconductor layer is made of polycrystalline silicon.

* * * * *